(12) United States Patent
Lofy

(10) Patent No.: US 8,222,511 B2
(45) Date of Patent: Jul. 17, 2012

(54) THERMOELECTRIC DEVICE

(75) Inventor: John Lofy, Claremont, CA (US)

(73) Assignee: Gentherm, Northville, MI (US)

( * ) Notice: Subject to any disclaimer, the term of this patent is extended or adjusted under 35 U.S.C. 154(b) by 922 days.

(21) Appl. No.: 11/833,892

(22) Filed: Aug. 3, 2007

(65) Prior Publication Data

US 2008/0047598 A1  Feb. 28, 2008

Related U.S. Application Data

(60) Provisional application No. 60/821,376, filed on Aug. 3, 2006.

(51) Int. Cl.
*H01L 35/28* (2006.01)
(52) U.S. Cl. ............................. 136/203
(58) Field of Classification Search ............ 136/203
See application file for complete search history.

(56) References Cited

U.S. PATENT DOCUMENTS

| | | | |
|---|---|---|---|
| 3,090,206 A | 6/1960 | Anders | |
| 3,077,079 A | 2/1963 | Pietsch | |
| 3,136,577 A | 6/1964 | Richard | |
| 3,137,523 A | 6/1964 | Karner | |
| 3,240,628 A | 3/1966 | Sonntag, Jr. | |
| 3,325,312 A | 6/1967 | Sonntag, Jr. | |
| 3,326,727 A | 6/1967 | Fritts | |
| 3,351,498 A | 11/1967 | Shinn et al. | |
| 3,767,470 A | 10/1973 | Hines | |
| 3,819,418 A | 6/1974 | Winkler et al. | |
| 3,870,568 A | 3/1975 | Oesterhelt et al. | |
| 3,902,923 A | 9/1975 | Evans et al. | |
| 4,413,857 A | 11/1983 | Hayashi | |

(Continued)

FOREIGN PATENT DOCUMENTS

DE   10238552   8/2001

(Continued)

OTHER PUBLICATIONS

Feher, Steve, Thermoelectric Air Conditioned Variable Temperature Seat (VTS) & Effect Upon Vehicle Occupant Comfort, Vehicle Energy Efficiency, and Vehicle Environment Compatibility, SAE Technical Paper, Apr. 1993, pp. 341-349.

(Continued)

*Primary Examiner* — Jennifer Michener
*Assistant Examiner* — Dustin Q Dam
(74) *Attorney, Agent, or Firm* — Knobbe, Martens, Olson & Bear, LLP

(57) ABSTRACT

A thermoelectric device comprises a plurality of semiconductor elements comprising a first set of semiconductor elements and a second set of semiconductor elements, which include dissimilar electrical properties. The semiconductor elements are oriented in a substantially hexagonal array that includes rows in which semiconductor elements of the first and second sets of semiconductor elements alternate. The thermoelectric device also comprises a first set of electrical conductors and a second set of electrical conductors; each of the first set of electrical conductor being electrically coupled to the first end of a semiconductor element of the first set of semiconductor elements and the first end of a semiconductor element of the second set of semiconductor elements, each of the second set of electrical conductors are electrically coupled to the second end of a semiconductor element of the first set of semiconductor elements and the a second end of a semiconductor element of the second set of semiconductor elements such that the plurality of semiconductor elements are electrically coupled to each other in series.

22 Claims, 14 Drawing Sheets

U.S. PATENT DOCUMENTS

| | | | |
|---|---|---|---|
| 4,438,070 A | 3/1984 | Stephens et al. | |
| 4,459,428 A | 7/1984 | Chou | |
| 4,518,700 A | 5/1985 | Stephens | |
| 4,671,567 A | 6/1987 | Frobose | |
| 4,685,727 A | 8/1987 | Cremer et al. | |
| 4,704,320 A | 11/1987 | Mizunoya et al. | |
| 4,782,664 A | 11/1988 | Sterna et al. | |
| 4,947,648 A | 8/1990 | Harwell et al. | |
| 5,002,336 A | 3/1991 | Feher | |
| 5,106,161 A | 4/1992 | Meiller | |
| 5,117,638 A | 6/1992 | Feher | |
| 5,279,128 A | 1/1994 | Tomatsu et al. | |
| 5,385,382 A | 1/1995 | Single, II et al. | |
| 5,430,322 A | 7/1995 | Koyanagi et al. | |
| 5,456,081 A | 10/1995 | Chrysler et al. | |
| 5,515,238 A | 5/1996 | Fritz et al. | |
| 5,597,200 A | 1/1997 | Gregory et al. | |
| 5,626,021 A | 5/1997 | Karunasiri et al. | |
| 5,637,921 A | 6/1997 | Burward-Hoy | |
| 5,667,622 A | 9/1997 | Hasegawa et al. | |
| 5,724,818 A | 3/1998 | Iwata et al. | |
| 5,802,856 A | 9/1998 | Schaper et al. | |
| 5,865,031 A | 2/1999 | Itakura | |
| 5,921,314 A | 7/1999 | Schuller et al. | |
| 5,924,766 A | 7/1999 | Esaki et al. | |
| 5,927,817 A | 7/1999 | Ekman et al. | |
| 5,950,067 A | 9/1999 | Maegawa et al. | |
| 5,952,728 A | 9/1999 | Imanishi et al. | |
| 5,987,893 A | 11/1999 | Schulz-Harder et al. | |
| 5,994,637 A | 11/1999 | Imanishi et al. | |
| 6,003,950 A | 12/1999 | Larsson | |
| 6,019,420 A | 2/2000 | Faust et al. | |
| 6,059,018 A | 5/2000 | Yoshinori et al. | |
| 6,062,641 A | 5/2000 | Suzuki et al. | |
| 6,079,485 A | 6/2000 | Esaki et al. | |
| 6,086,831 A | 7/2000 | Harness et al. | |
| 6,094,919 A | 8/2000 | Bhatia | |
| 6,097,088 A | 8/2000 | Sakuragi | |
| 6,112,525 A | 9/2000 | Yoshida et al. | |
| 6,119,463 A | 9/2000 | Bell | |
| 6,145,925 A | 11/2000 | Eksin et al. | |
| 6,186,592 B1 | 2/2001 | Orizakis et al. | |
| 6,189,966 B1 | 2/2001 | Faust et al. | |
| 6,196,627 B1 | 3/2001 | Faust et al. | |
| 6,206,465 B1 | 3/2001 | Faust et al. | |
| 6,222,243 B1 | 4/2001 | Kishi et al. | |
| 6,223,539 B1 | 5/2001 | Bell | |
| 6,262,357 B1 * | 7/2001 | Johnson et al. | 136/203 |
| 6,306,673 B1 | 10/2001 | Imanishi et al. | |
| 6,347,521 B1 | 2/2002 | Kadotani et al. | |
| 6,391,676 B1 | 5/2002 | Tsuzaki et al. | |
| 6,400,013 B1 | 6/2002 | Tsuzaki et al. | |
| 6,539,725 B2 | 4/2003 | Bell | |
| RE38,128 E | 6/2003 | Gallup et al. | |
| 6,573,596 B2 | 6/2003 | Saika | |
| 6,574,967 B1 | 6/2003 | Park et al. | |
| 6,583,638 B2 | 6/2003 | Costello et al. | |
| 6,598,251 B2 | 7/2003 | Habboub et al. | |
| 6,598,405 B2 | 7/2003 | Bell | |
| 6,604,785 B2 | 8/2003 | Bargheer et al. | |
| 6,605,955 B1 | 8/2003 | Costello et al. | |
| 6,606,866 B2 | 8/2003 | Bell | |
| 6,619,044 B2 | 9/2003 | Batchelor et al. | |
| 6,619,736 B2 | 9/2003 | Stowe et al. | |
| 6,625,990 B2 | 9/2003 | Bell | |
| 6,626,488 B2 | 9/2003 | Pfahler | |
| 6,637,210 B2 | 10/2003 | Bell | |
| 6,644,735 B2 | 11/2003 | Bargheer et al. | |
| 6,672,076 B2 | 1/2004 | Bell | |
| 6,676,207 B2 | 1/2004 | Rauh et al. | |
| 6,700,052 B2 | 3/2004 | Bell | |
| 6,711,904 B1 | 3/2004 | Law et al. | |
| 6,725,669 B2 | 4/2004 | Melaragni | |
| 6,761,399 B2 | 7/2004 | Bargheer et al. | |
| 6,786,541 B2 | 9/2004 | Haupt et al. | |
| 6,786,545 B2 | 9/2004 | Bargheer et al. | |
| 6,804,966 B1 | 10/2004 | Chu et al. | |
| 6,808,230 B2 | 10/2004 | Buss et al. | |
| 6,812,395 B2 | 11/2004 | Bell | |
| 6,815,814 B2 | 11/2004 | Chu et al. | |
| 6,817,191 B2 | 11/2004 | Watanabe | |
| 6,828,528 B2 | 12/2004 | Stowe et al. | |
| 6,845,622 B2 | 1/2005 | Sauciuc et al. | |
| 6,857,697 B2 | 2/2005 | Brennan et al. | |
| 6,893,086 B2 | 5/2005 | Bajic et al. | |
| 6,907,739 B2 | 6/2005 | Bell | |
| 6,959,555 B2 | 11/2005 | Bell | |
| 6,976,734 B2 | 12/2005 | Stoewe | |
| 7,040,710 B2 | 5/2006 | White et al. | |
| 7,070,232 B2 | 7/2006 | Minegishi et al. | |
| 7,084,502 B2 | 8/2006 | Bottner et al. | |
| 7,108,319 B2 | 9/2006 | Hartwich et al. | |
| 7,114,771 B2 | 10/2006 | Lofy et al. | |
| 7,178,344 B2 | 2/2007 | Bell | |
| 7,201,441 B2 | 4/2007 | Stoewe et al. | |
| 7,224,059 B2 | 5/2007 | Shimada et al. | |
| 7,231,772 B2 | 6/2007 | Bell | |
| 7,244,887 B2 | 7/2007 | Miley | |
| 7,246,496 B2 | 7/2007 | Goenka et al. | |
| 7,273,981 B2 | 9/2007 | Bell | |
| 7,299,639 B2 | 11/2007 | Leija et al. | |
| 7,360,365 B2 | 4/2008 | Codecasa et al. | |
| 7,380,586 B2 | 6/2008 | Gawthrop | |
| 7,426,835 B2 | 9/2008 | Bell | |
| 7,475,464 B2 | 1/2009 | Lofy et al. | |
| 7,587,901 B2 | 9/2009 | Petrovski | |
| 7,587,902 B2 | 9/2009 | Bell | |
| 7,591,507 B2 | 9/2009 | Giffin et al. | |
| 7,608,777 B2 | 10/2009 | Bell et al. | |
| 7,640,754 B2 | 1/2010 | Wolas | |
| 7,708,338 B2 | 5/2010 | Wolas | |
| RE41,765 E | 9/2010 | Gregory et al. | |
| 7,827,805 B2 | 11/2010 | Comiskey et al. | |
| 7,877,827 B2 | 2/2011 | Marquette et al. | |
| 2002/0062854 A1 | 5/2002 | Sharp | |
| 2003/0041892 A1 * | 3/2003 | Fleurial et al. | 136/227 |
| 2004/0090093 A1 | 5/2004 | Kamiya et al. | |
| 2004/0177876 A1 | 9/2004 | Hightower | |
| 2004/0177877 A1 | 9/2004 | Hightower | |
| 2005/0012204 A1 | 1/2005 | Strnad | |
| 2005/0257532 A1 | 11/2005 | Ikeda et al. | |
| 2005/0268956 A1 | 12/2005 | Take | |
| 2005/0285438 A1 | 12/2005 | Ishima et al. | |
| 2006/0005944 A1 | 1/2006 | Wang et al. | |
| 2006/0087160 A1 | 4/2006 | Dong et al. | |
| 2006/0102224 A1 | 5/2006 | Chen et al. | |
| 2006/0118158 A1 | 6/2006 | Zhang et al. | |
| 2006/0201161 A1 | 9/2006 | Hirai et al. | |
| 2006/0214480 A1 | 9/2006 | Terech | |
| 2006/0225441 A1 | 10/2006 | Goenka et al. | |
| 2006/0243317 A1 | 11/2006 | Venkatasubramanian | |
| 2006/0273646 A1 | 12/2006 | Comiskey et al. | |
| 2007/0017666 A1 | 1/2007 | Goenka et al. | |
| 2007/0163269 A1 | 7/2007 | Chung et al. | |
| 2007/0200398 A1 | 8/2007 | Wolas et al. | |
| 2007/0204629 A1 | 9/2007 | Lofy | |
| 2007/0227158 A1 | 10/2007 | Kuchimachi | |
| 2007/0262621 A1 | 11/2007 | Dong et al. | |
| 2007/0277313 A1 | 12/2007 | Terech | |
| 2008/0023056 A1 | 1/2008 | Kambe et al. | |
| 2008/0028768 A1 | 2/2008 | Goenka | |
| 2008/0028769 A1 | 2/2008 | Goenka | |
| 2008/0053108 A1 | 3/2008 | Wen | |
| 2008/0078186 A1 | 4/2008 | Cao | |
| 2008/0087316 A1 | 4/2008 | Inaba et al. | |
| 2008/0148481 A1 | 6/2008 | Brykalski et al. | |
| 2008/0164733 A1 | 7/2008 | Giffin et al. | |
| 2008/0166224 A1 | 7/2008 | Giffin et al. | |
| 2008/0173022 A1 | 7/2008 | Petrovski | |
| 2008/0223841 A1 | 9/2008 | Lofy | |
| 2008/0289677 A1 | 11/2008 | Bell et al. | |
| 2008/0307796 A1 | 12/2008 | Bell et al. | |
| 2009/0000310 A1 | 1/2009 | Bell et al. | |
| 2009/0025770 A1 | 1/2009 | Lofy | |
| 2009/0026813 A1 | 1/2009 | Lofy | |
| 2009/0033130 A1 | 2/2009 | Marquette et al. | |
| 2009/0178700 A1 | 7/2009 | Heremans et al. | |

| | | | | | | |
|---|---|---|---|---|---|---|
| 2009/0193814 | A1 | 8/2009 | Lofy | WO | WO 98/07898 | 2/1998 |
| 2009/0218855 | A1 | 9/2009 | Wolas | WO | WO 02/11968 | 2/2002 |
| 2009/0235969 | A1 | 9/2009 | Heremans et al. | WO | WO 03/051666 | 6/2003 |
| 2009/0269584 | A1 | 10/2009 | Bell et al. | WO | WO 03/063257 | 7/2003 |
| 2010/0011502 | A1 | 1/2010 | Brykalski et al. | | | |
| 2010/0193498 | A1 | 8/2010 | Walsh | | | |

FOREIGN PATENT DOCUMENTS

| | | |
|---|---|---|
| DE | 10115242 | 10/2002 |
| GB | 874660 | 9/1961 |
| JP | 10332883 | 12/1998 |
| JP | 2003204087 | 7/2003 |

OTHER PUBLICATIONS

Lofy, J. et al., Thermoelectrics for Environmental Control in Automobiles, Proceeding of Twenty-First International Conference on Thermoelectrics (ICT 2002), published 2002, pp. 471-476.

* cited by examiner

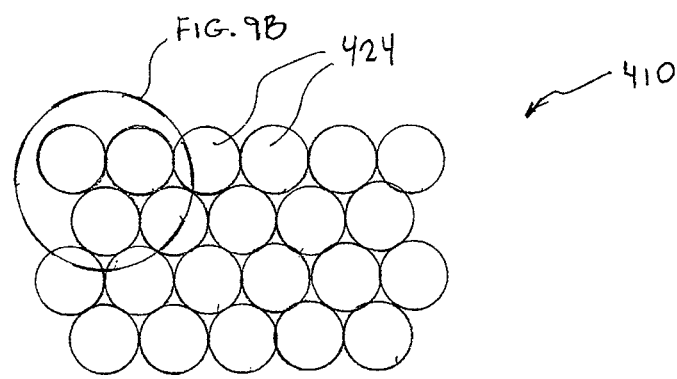
FIG. 9A
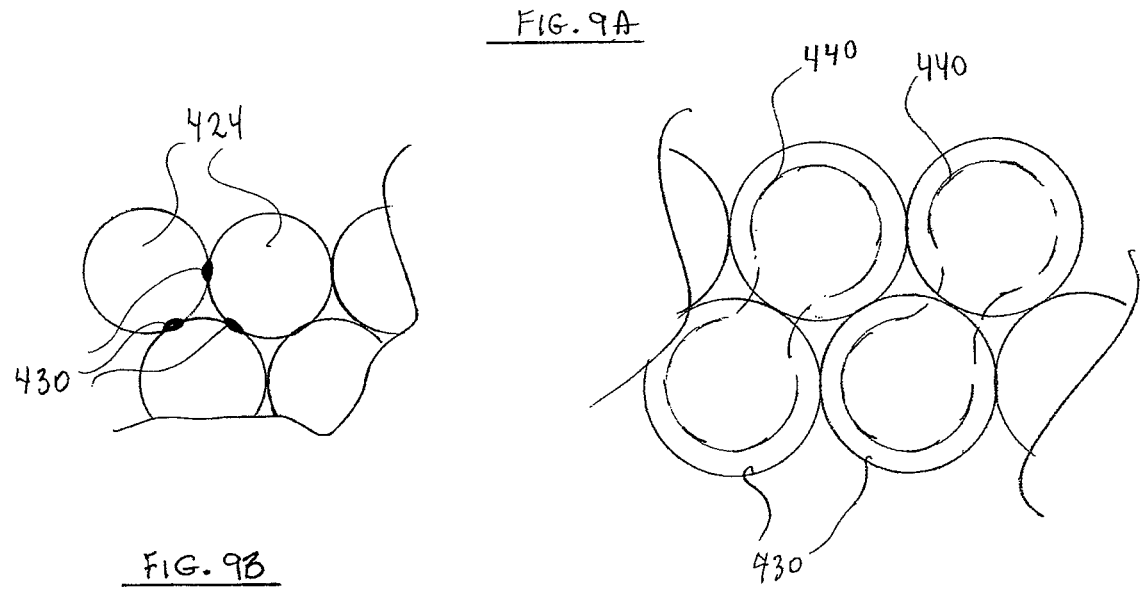
FIG. 9B
FIG. 9C

THERMOELECTRIC DEVICE

CROSS-REFERENCE TO RELATED APPLICATIONS

This application claims the priority benefit under 35 U.S.C. §119(e) of U.S. Provisional Application No. 60/821,376, filed Aug. 3, 2006, the entirety of which is hereby incorporated by reference herein.

BACKGROUND OF THE INVENTION

1. Field of the Invention

The present invention relates generally to thermoelectric devices and, more particularly, to a Peltier circuit.

2. Description of the Related Art

A Peltier circuit is a thermoelectric device comprising two sides. When voltage is applied in one direction, one side creates heat while the other side absorbs heat. Switching polarity of the circuit creates the opposite effect. In a typical arrangement, a Peltier device comprises a closed circuit that includes dissimilar materials. As a DC voltage is applied to the closed circuit, a temperature change is produced at the junction of the dissimilar materials. Depending on the direction of the electrical current, heat is either emitted or absorbed at a particular junction. The Peltier circuit can include several such junctions connected electrically in series. The junctions can be sandwiched between two electrical isolation members (e.g., ceramic plates), which can form the cold side and the hot side of the thermoelectric device. The cold side can be thermally coupled to an object to be cooled and the hot side can be thermally coupled to a heat sink which dissipates heat to the environment.

U.S. patent application Ser. No. 11/047,077 filed Jan. 31, 2005 and published on Jun. 22, 2006 as U.S. Publication No. 2006-0130490, the entirety of which is incorporated by referenced herein, discloses a vehicle seat ventilation system that utilizes a Peltier circuit to selectively provide heated and/or cooled air to a vehicle seat for enhancing passenger comfort. Air or any other fluid can be passed over and/or near the thermoelectric device for selective heating or cooling. The conditioned air or other fluid can then be directed to the vehicle seat. Use of Peltier circuits can be particularly advantageous in such applications because of their relatively compact size. Consequently, such thermoelectric devices can provide conditioned (e.g., heated or cooled) air or other fluid to a vehicle seat, other seating assembly (e.g., bed, office chair, sofa, etc.) or any other targeted area (e.g., neck warmer/cooler, climate controlled pet house, etc.).

SUMMARY

Some conventional thermoelectric devices comprise solid state P and N junction type semi-conductor elements connected in series. The arrangement of these semi-conductor elements is often in a rectangular array, with rows and columns of elements having a substantially square cross-sectional profile. Some newer designs of thermoelectric devices utilize cylindrical shaped semiconductor elements instead of square shaped semi-conductor elements. However, if the spacing between semiconductor elements is kept the same as in arrangements with square cross-sectional shapes, the semiconductor elements lose some of their volume (e.g., the "corners" of the square are cut off to make the cylinder). Accordingly, in order to pack the same amount of semiconductor element cross sectional area into the thermoelectric device assembly, the overall size of the thermoelectric device needs to be made larger.

Accordingly, one aspect of the present invention comprises a thermoelectric device that includes a first substrate and a second substrate disposed apart from each other. The first and second substrates are configured to provide electrical insulation. The device also includes a plurality of semiconductor elements that comprises a first set of semiconductor elements and a second set of semiconductor elements. The first and second sets of semiconductor elements have dissimilar electrical properties. Each of the plurality of semiconductor elements have a first end disposed towards the first substrate, a second end disposed towards the second substrate and a body extending between the first and second end and having a substantially circular cross-section. The plurality of semiconductor elements is disposed in a substantially hexagonal array comprising rows in which semiconductor elements of the first and second sets of semiconductor elements alternate. The device also includes a first set of electrical conductors and a second set of electrical conductors. Each of the first set of electrical conductor are electrically coupled to the first end of a semiconductor element of the first set of semiconductor elements and the first end of a semiconductor element of the second set of semiconductor elements. Each of the second set of electrical conductors are electrically coupled to the second end of a semiconductor element of the first set of semiconductor elements and the a second end of a semiconductor element of the second set of semiconductor elements such that the plurality of semiconductor elements are electrically coupled to each other in series.

According to some embodiments, a thermoelectric device comprises a first substrate and a second substrate disposed apart from each other, the first and second substrates configured to provide electrical insulation. In addition, the thermoelectric device comprises a plurality of semiconductor elements comprising a first set of semiconductor elements and a second set of semiconductor elements, the first and second sets of semiconductor elements having dissimilar electrical properties, each of the plurality of semiconductor elements having a first end disposed towards the first substrate, a second end disposed towards the second substrate and a body extending between the first and second end, the plurality of semiconductor elements disposed in a substantially hexagonal array comprising rows in which semiconductor elements of the first and second sets of semiconductor elements alternate. In addition, the thermoelectric device comprises a first set of electrical conductors and a second set of electrical conductors; each of the first set of electrical conductor being electrically coupled to the first end of a semiconductor element of the first set of semiconductor elements and the first end of a semiconductor element of the second set of semiconductor elements, each of the second set of electrical conductors are electrically coupled to the second end of a semiconductor element of the first set of semiconductor elements and the a second end of a semiconductor element of the second set of semiconductor elements such that the plurality of semiconductor elements are electrically coupled to each other in series.

In some embodiments, a thermoelectric device includes first and second substrates and a plurality of semiconductor elements comprising a center, the semiconductor elements disposed between the first and second substrates, the plurality of semiconductor elements comprising a first group of semiconductor elements having a first set of electrical properties and a second group of semiconductor elements having a second set of electrical properties. The thermoelectric device further includes a first set of electrical conductors disposed between the plurality of semiconductors and the first substrate and a second set of electrical conductors disposed between the plurality of semiconductors and the second substrates. In some embodiments, the plurality of semiconductor elements, the first set of electrical conductors and the second set of electrical conductors are arranged such that the plurality of semiconductor elements are electrically coupled to each other in series with the first and second groups of semiconductor elements in an alternating arrangement. In one embodiment, the semiconductor elements are positioned along at least two generally linear rows. In another embodiment, the semiconductor elements from a row are generally positioned half-way between semiconductor elements from an adjacent row and the centers of each of at least three immediately adjacent semiconductor elements form a triangle shape, the triangle shape comprising three internal angles.

In other embodiments, a thermoelectric device includes first and second substrates and a plurality of semiconductor elements comprising a center, the semiconductor elements disposed between the first and second substrates, the plurality of semiconductor elements comprising a first group of semiconductor elements having a first set of electrical properties and a second set of semiconductor elements having a second set of electrical properties. The thermoelectric device further includes a first set of electrical conductors disposed between the plurality of semiconductors and the first substrate and a second set of electrical conductors disposed between the plurality of semiconductors and the second substrates. In one embodiment, the semiconductor elements are arranged in series and a density of semiconductor elements is higher in a first portion of the thermoelectric device than in at least one other portion of the thermoelectric device.

BRIEF DESCRIPTION OF THE DRAWINGS

These and other features, aspects and advantages of the present devices, systems and methods are described in detail below with reference to drawings of certain preferred embodiments, which are intended to illustrate, but not to limit, the present inventions. The drawings contain twenty-four (24) figures. It is to be understood that the attached drawings are for the purpose of illustrating concepts of the present inventions and may not be to scale.

FIGS. 9A through 9C illustrate top views of closely packed semiconductor elements of a thermoelectric device according to one embodiment;

DETAILED DESCRIPTION OF THE PREFERRED EMBODIMENTS

The thermoelectric devices and the various systems, apparatuses, methods and features associated with them are described in the context of a climate controlled seating assembly for an automobile or other vehicle because they have particular utility in this context. However, the devices, systems and methods described herein, as well as their various features, can be used in other contexts as well, such as, for example, but without limitation, for other climate controlled seating assemblies (e.g., beds, office chairs, theater seats, sofas, etc.), other climate control devices (e.g., climate controlled pet houses) and the like.

The various embodiments of thermoelectric devices disclosed and illustrated in this application include semiconductor elements that are arranged in a repeating hexagonal or other closely-packed pattern. Such arrangements can advantageously help reduce or minimize the space between adjacent semiconductor elements. Thus, such arrangements can help increase the number of semiconductor elements that can be included within a particular area of a thermoelectric device. In turn, such features can permit the size of a thermoelectric device to be reduced, for a particular desired level of heating or cooling. Although some of the embodiments herein disclose a thermoelectric device having thermoelectric elements arranged in a generally hexagonal pattern, it will be appreciated that the space-saving features and other advantages of such configurations can also be achieved by other patterns. The hexagonal pattern as shown and discussed herein is merely one example of such an arrangement.

Figure 1A:
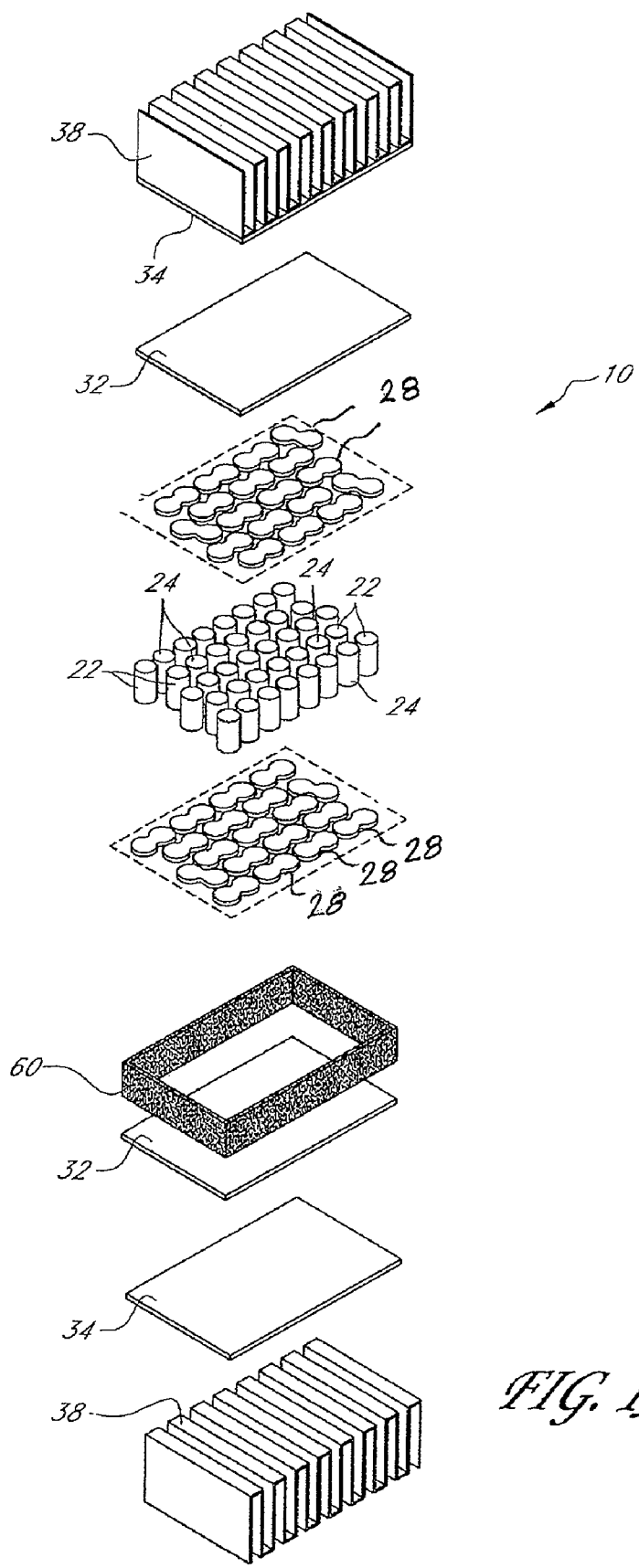
FIG. 1A illustrates an exploded perspective view of a thermoelectric device according to one embodiment.
Figure 1B:
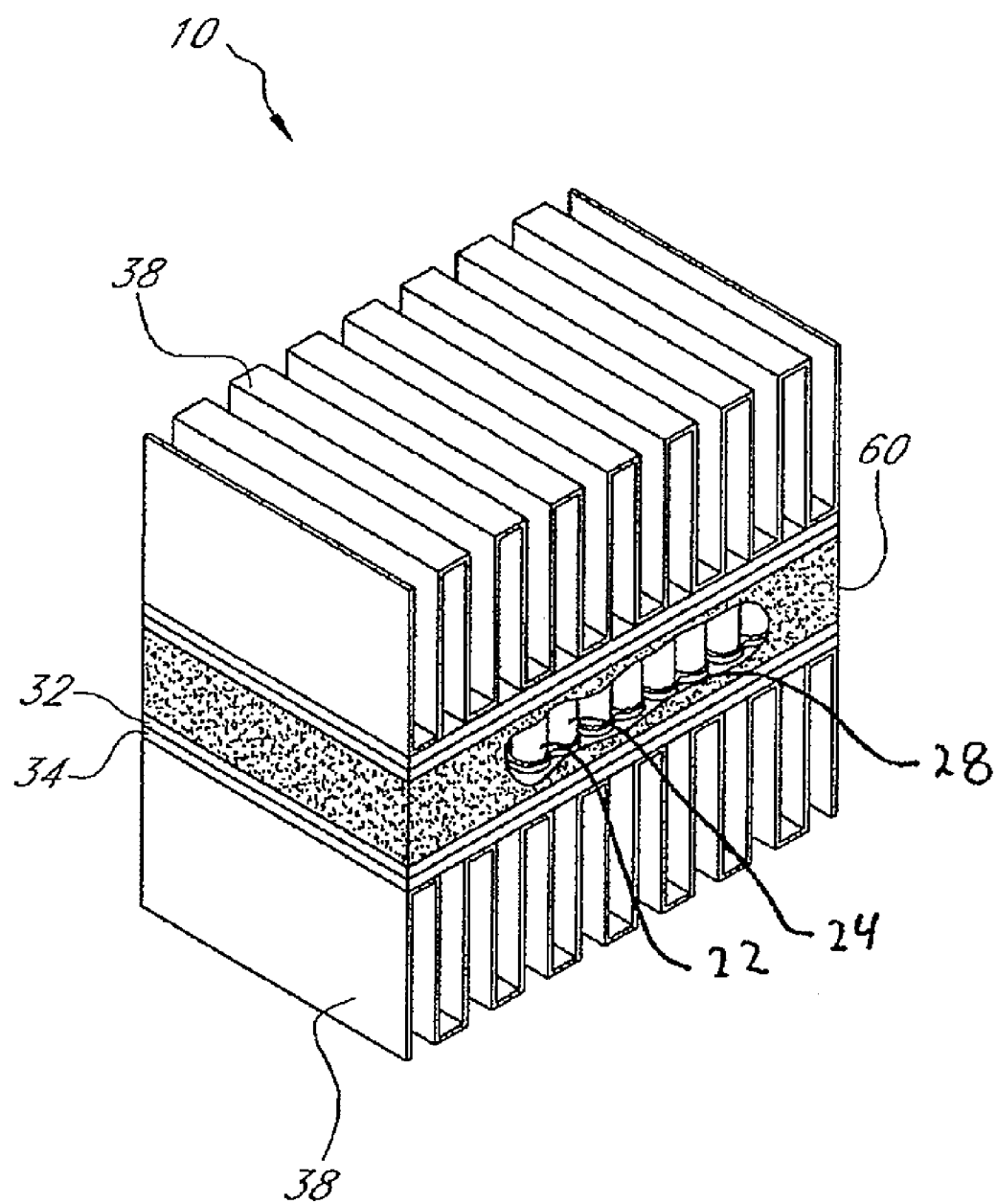
FIG. 1B illustrates a perspective view of an assembled version of the thermoelectric device of FIG. 1A.
Figure 2A:
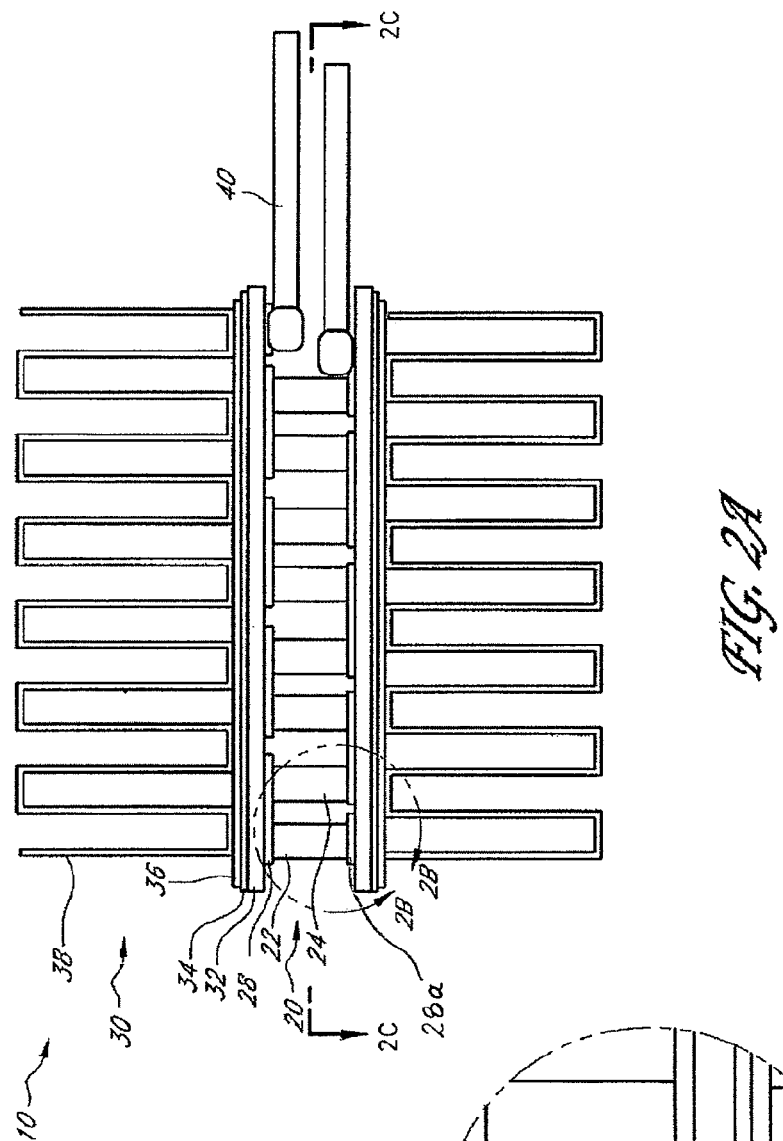
FIG. 2A illustrates a side view of the thermoelectric device of FIG. 1A.
Figure 2B:
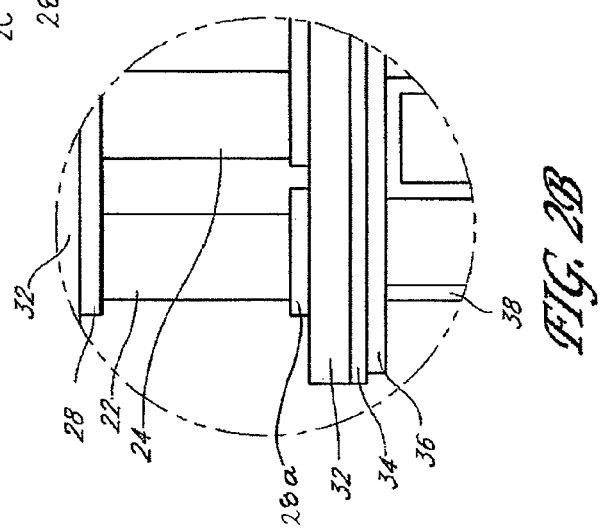
FIG. 2B illustrates an enlarged view of the portion labeled 2B-2B in FIG. 2A.

FIG. 1A illustrates a thermoelectric device 10 in exploded perspective view with its various components separated for ease of inspection. FIG. 1B is a side perspective view of an assembled thermoelectric device 10 similar to the one illustrated in FIG. 1A. Further, FIG. 2A provides a side view of the thermoelectric device 10 with portions removed or hidden, and FIG. 2B shows an enlarged view of a portion of FIG. 2A. In addition, FIG. 3 illustrates a perspective view of a thermoelectric device 10 as in FIGS. 1A through 2A.

With initial reference to FIGS. 1A and 1B, the thermoelectric device 10 can include a plurality of dissimilar conductive elements or pellets 22, 24. As discussed in greater detail herein, pairs of dissimilar conductive elements 22, 24 can be coupled together by a series of electrical joining elements or tabs 28, which are, in turn, disposed between a pair of opposing substrates 32. The substrates 32 can comprise polyimide or another material that has desirable electrical insulation and thermal conductive properties. In the depicted embodiment, each substrate 32 is thermally coupled to a heat transfer member 38 (e.g., fins) through a thermal conductive element 34 (e.g., copper pads). In some embodiments, a seal 60 is optionally provided between the opposing substrates 32 to protect the elements 22, 24 that are situated therebetween.

FIGS. 2A and 2B illustrate different views of an embodiment of a thermoelectric device 10 with the seal 60 omitted to facilitate inspection of the internal components situated between the opposing substrates 32. In some embodiments, the conductive elements 22, 24 comprise two groups having dissimilar electrical properties. For example, the two dissimilar groups include alternating N-type semiconductor elements 22 and P-type semiconductor elements 24. The N-type semiconductor elements 22 and P-type semiconductor elements 24 can comprise a bismuth-tellurium alloy ($Bi_2Te_3$ alloy) and/or any other doped or non-doped metals. According to some embodiments, the ends of each of the N-type and P-type semiconductor elements 22, 24 are coated with a diffusion barrier (not shown). Such a diffusion barrier can reduce or minimize the flow of electrons out of the semiconductor elements 22, 24. The diffusion barrier can comprise one or more materials, such as, for example, nickel, titanium/tungsten alloy, molybdenum and/or the like.

As illustrated in FIG. 2A, pairs of dissimilar semiconductor elements 22, 24 can be coupled at their tops and bottoms using joining elements or tabs 28. Semiconductor elements 22, 24 of the same type are not disposed on the same joining tab 28. That is, each joining tab 28 is coupled to only one N-type semiconductor element 22 and only one P-type semiconductor element 24. In addition, the upper and lower joining tabs 28 are configured such that the semiconductor elements 22, 24 are arranged in an alternating series. Accordingly, the semiconductor elements 22, 24 are electrically connected in series with each other.

With continued reference to the embodiment illustrated in FIG. 2A, the top of a first N-type semiconductor element 22 is electrically coupled to a first joining tab or element 28. In turn, the first joining tab 28 is electrically coupled to the top of a first P-type semiconductor element 24 positioned to the right of the first N-type semiconductor element 22. A second joining tab 28a can be coupled to the bottom of the first N-type semiconductor element 22 and a second P-type semiconductor element (see FIGS. 2C and 3). With reference to FIG. 1A, the joining tabs 28 are coupled to the semiconductor elements 22, 24 such that all the semiconductor elements 22, 24 are connected in series with each other. In some embodiments, the joining tabs 28 can include a plurality of discrete elements or members which are coupled, either directly or indirectly, to the substrate 32 and/or an intermediate component. In a modified embodiment, the joining tabs 28 are formed by tracing or otherwise forming a layer of conductive material on the substrate 32 and/or an intermediate component or element.

As discussed, a heat transfer member 38 (e.g., fins) can be positioned on the top and bottom sides of a thermoelectric device 10. In some embodiments, the thermoelectric device 10 is capable of operating without the heat transfer members 38. However, the presence of such heat transfer members 38 can advantageously increase the efficiency of heat transfer between the thermoelectric device 10 and the ambient atmosphere or a fluid which passes through or in the vicinity of the device 10 for temperature conditioning.

With reference to FIGS. 2A and 2B, an electrically-conducting solder (not shown) can be used to mount the N-type semiconductor elements 22 and P-type semiconductor elements 24 to of the joining tabs or elements 28. In one embodiment, the conducting solder can comprise tin and/or antimony. However, one or more other metals or non-metals can be used, either in lieu of or in addition to the tin or antimony. For instance, in some embodiments, bismuth can be alloyed with tin to create the solder. Other methods of affixing the semiconductor elements 22, 24 to the joining tabs 28 can be used, provided an electrical connection is permitted between the semiconductor elements 22, 24 and the joining tabs 28. In turn, the joining tabs 28 can be securely mounted to the substrate 32 via an adhesive or any other substance, device and/or method.

The substrates 32 of the thermoelectric device 10 are preferably configured to provide electrical insulation and thermal conduction. In some embodiments, the substrates 32 can be constructed of a ceramic material, such as, for example, alumina (ceramic), silicon and/or the like. However, one or more other types of materials can also be used, such as, for example, epoxy, polyimide or the like. In some embodiments, the substrates 32 are preferably sufficiently rigid to help maintain the shape of the thermoelectric device 10, especially when the device 10 is subjected to thermal expansion and/or contraction stresses. In such embodiments, the substrate 32 can be formed from certain ceramic materials, which are known in the art. In other embodiments, however, the substrates 32 can be relatively flexible, allowing the thermoelectric device 10 to bend, deform or otherwise change shape more easily. For example, the substrate 32 can be formed from a polymer resin, for example, filled polyimide (e.g., Kapton®).

As discussed, the substrates 32 can advantageously serve as electrical insulators to allow the electrical current to properly flow through the N-type and P-type semiconductor elements. According to some embodiments, the thickness of a substrate can be between 5 and 500 micrometers ($\mu m$). For example in some embodiments, the substrate thickness ranges between 10 and 20 $\mu m$ (e.g., 17 $\mu m$). However, it will be appreciated that the substrate thickness can be smaller than 5 $\mu m$ or larger than 500 $\mu m$, as desired or required. As illustrated in FIGS. 2A and 2B, the substrates 32 can be sufficiently large to partially or completely cover the semiconductor elements 22, 24 and joining tabs 28. Further, the joining tabs 28 can be coupled to the electrically-insulating substrate 32 through solder, epoxy and/or any other attachment device, system or method.

With continued reference to FIGS. 2A and 2B, the heat conductor element or layer 34 can be disposed between the substrate 32 and the heat transfer member 38. Accordingly, one or more heat conductor layers 34 can be disposed on the outside of each substrate 32 (e.g., opposite of the semiconductor elements). The heat conductor layer 34 comprises a plate having copper and/or another material that has relatively high thermal conductivity. Of course, it will be appreciated that the heat conductor layer 34 can comprise any other materials, regardless of their exact thermal conductive properties.

In some embodiments, the thickness of the heat conductor layer 34 is between 10 and 400 μm. However, the thickness of the heat conductor layer 34 can be greater than 400 μm or smaller than 10 μm. One or more heat transfer members 38 (e.g., fins) can be coupled, either directly or indirectly, to the heat conductor layer 34. In some arrangements, the heat conductor layer 34 is attached to a heat transfer member 38 using by a layer of heat-conducting solder 36. However, any other attachment substance, device and/or method can also be used, such as, for example, adhesives, welds, fasteners and/or the like.

In other embodiments, however, a thermoelectric device need not comprise a heat conductor layer or member 34. In such arrangements, the heat transfer members 38 can be directly attached to the substrate 32 and/or any other components of the device 10. For example, a thermally conductive adhesive, layer or other member can be used to directly attach a heat transfer member 38 to the substrate 32. A heat conductor layer 38 (e.g., copper plate or pad) can be used when attempting to attach the heat transfer members 34 (e.g., fins) to the device 10 using soldering methods or the like.

With continued reference to the embodiment illustrated in FIG. 2A, the heat transfer member 38 can comprise one or more materials having a relatively high thermal conductivity (e.g., copper, aluminum, beryllium, alloys thereof, etc.). As shown, the heat transfer members 38 can be advantageously configured into a plurality of fins and/or other folded shapes that help enhance heat transfer with the surrounding environment. It will be appreciated that other materials and/or shapes can also be used, such as, for example, other copper alloys, aluminum, circularly-shaped members and the like. Additionally, the heat transfer between the heat transfer members 38 and the surrounding environment can be enhanced by providing a fluid transfer device (e.g., a fan) to transfer the fluid (e.g., air) over, through and/or in the vicinity of the heat transfer members 38.

When a current is passed through the N-type semiconductor elements 22 in series with the P-type semiconductor elements 24, one junction 28 on one side of the semiconductor elements 22, 24 is heated and the junction 28 on the other side of the thermoelectric elements 22, 24 is cooled. That is, when a voltage is applied in one direction through the semiconductor elements 22, 24, alternating junctions 28 of the N-type and P-type semiconductor elements 22, 24 will heat and cool, respectively, depending on the direction of current flow.

With reference to the embodiment of FIG. 2A, because the location of the junctions 28 of the semiconductor elements 22, 24 alternates between the top and bottom of the device 10, one side (e.g., top) of the device 10 heats and the opposite side (e.g., bottom) cools when a voltage is applied in one direction through the semiconductor elements 22, 24. Likewise, when the direction of the current is reversed, the opposite cooling/heating effect occurs (e.g., the top of the thermoelectric device 10 is cooled and the bottom is heated). Current can be applied to the device 10 through electrical connectors 40, which can be electrically coupled to one of the junctions 28.

With reference to FIGS. 1A and 1B, a thermoelectric device 10 can comprise a seal 60 that partially or completely surrounds the device between the substrates 32. In general, the seal 60 can be disposed between the two substrates 32 and surround the plurality of semiconductor elements 22, 24. The seal 60 can comprise one or more suitable materials. For example, in some embodiments, the seal comprises materials that are sufficient to inhibit moisture or other contaminants from entering an interior portion of the thermoelectric device 10. In some arrangements, the seal 60 can comprise a putty-like substance, plastics, epoxies and/or any other material. In one embodiment, room-temperature vulcanizing (RTV) silicone, a commercially available silicone rubber sealant, can be used. The seal 60 can extend around the perimeter of thermoelectric device 10. In some embodiments, the seal 60 can enclose the thermoelectric elements 22, 24 and extend between the substrates 32.

Figure 2C:
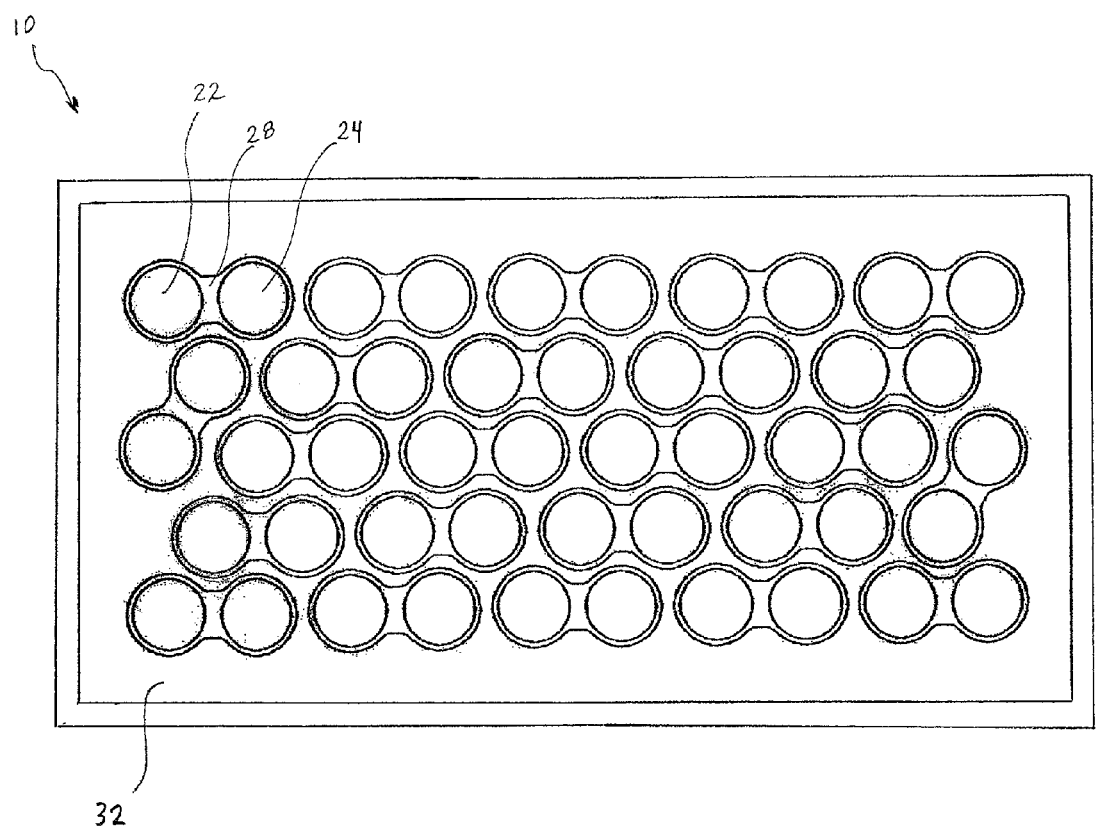
FIG. 2C illustrates a cross-section view taken through line 2C-2C of FIG. 2A with certain portions of the thermoelectric device removed for clarity.
Figure 3:
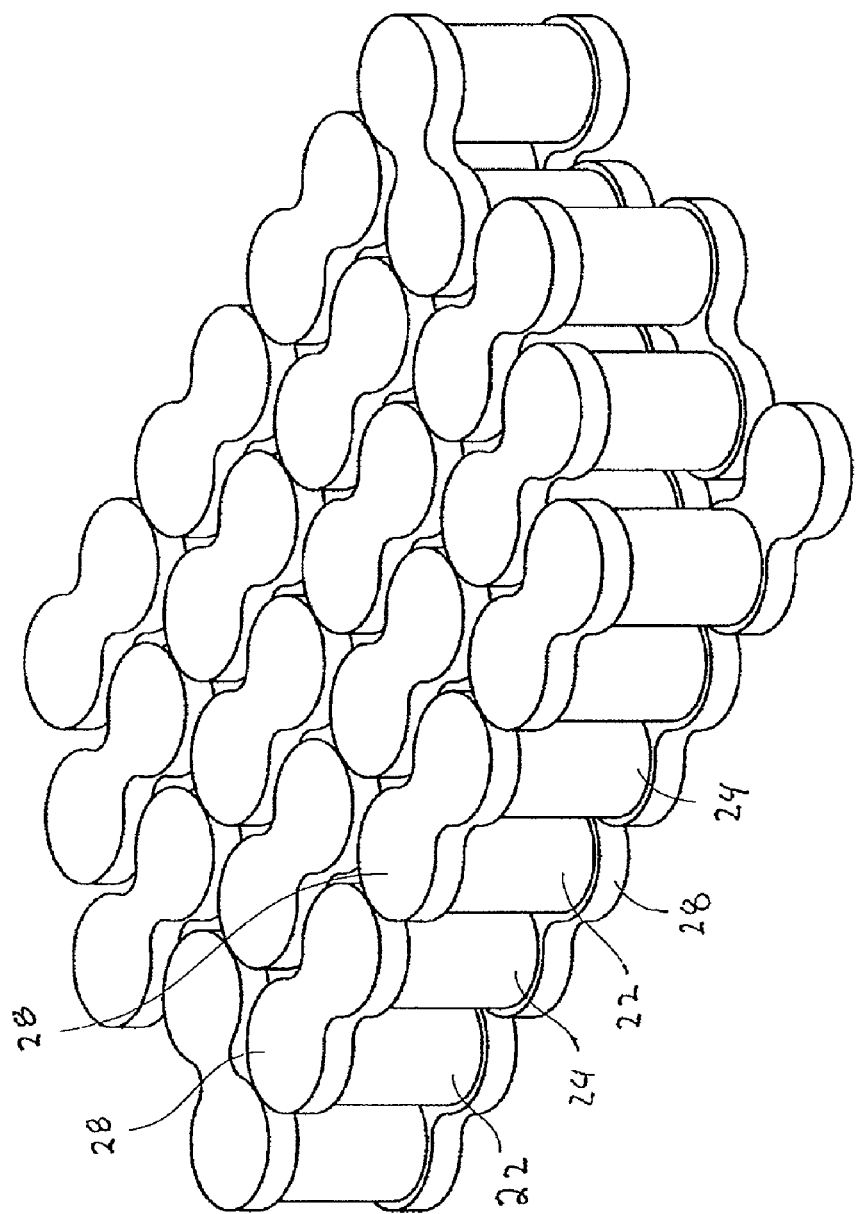
FIG. 3 illustrates a side perspective view of a thermoelectric device according to one embodiment.

FIG. 2C illustrates a cross-sectional view of the thermoelectric device 10 taken through line 2C-2C of FIG. 2B. As shown, the thermoelectric elements 22, 24 can have a generally cylindrical shape with a generally circular or round cross-section. The thermoelectric elements 22, 24 can be arranged in a repeating, generally hexagonal pattern, with each pair of dissimilar thermoelectric elements 22, 24 joined by electrical joining tabs 28. In one embodiment, the hexagonal pattern is characterized by at least some of the semiconductor elements 22, 24 having six other thermoelectric elements 22, 24 surrounding a central element at substantially equal distances and orientations. For elements 22, 24 not surrounded by six elements (e.g., elements 22, 24 near or at the sides of the array), the elements 22, 24 are still arranged in a hexagonal pattern with not all spaces occupied. In certain embodiments, the hexagonal pattern can be defined by three substantially equal axes that extend through the six surrounding elements 22, 24 and intersect at substantially equal angles of 60° at the element positioned at the center of the six surrounding elements 22, 24. The hexagonal pattern can form rows (generally horizontally orientated as illustrated in FIG. 2C) in which the dissimilar thermometric elements 22, 24 are arranged in an alternating pattern.

As discussed with reference to FIG. 2C, the semiconductor elements 22, 24 of a thermoelectric device 10 can be arranged in a "regular hexagonal" pattern, in which the elements 22, 24 are generally equally spaced from each other at 60° angles. However, it will be appreciated that different methods of distributing the elements 22, 24 can also be used to improve the spacing of the semiconductor elements 22, 24. In some embodiments, the semiconductor elements 22, 24 of the device 10 are arranged in a non-regular hexagonal pattern (e.g., the elements 22, 24 are not equally spaced at 60° angles from each other). In yet other embodiments, the elements 22, 24 are arranged in a non-hexagonal pattern, such as, for example, a pentagonal, octagonal, prism or any other repeating or random pattern.

In the embodiment illustrated in FIG. 2C, the semiconductor elements 22, 24, joining tabs or elements 28 and other components of the thermoelectric device 10 comprise a particular size, shape, spacing, location, density and other properties and characteristics. However, it will be appreciated that one or more of these or any other properties or characteristics can be varied as desired or required by a particular application. For example, the elements 22, 24 can be positioned closer or further apart, the elements 22, 24 can comprise a non-circular shape, the joining tabs 28 can have a different size and/or the like.

Figure 2D:
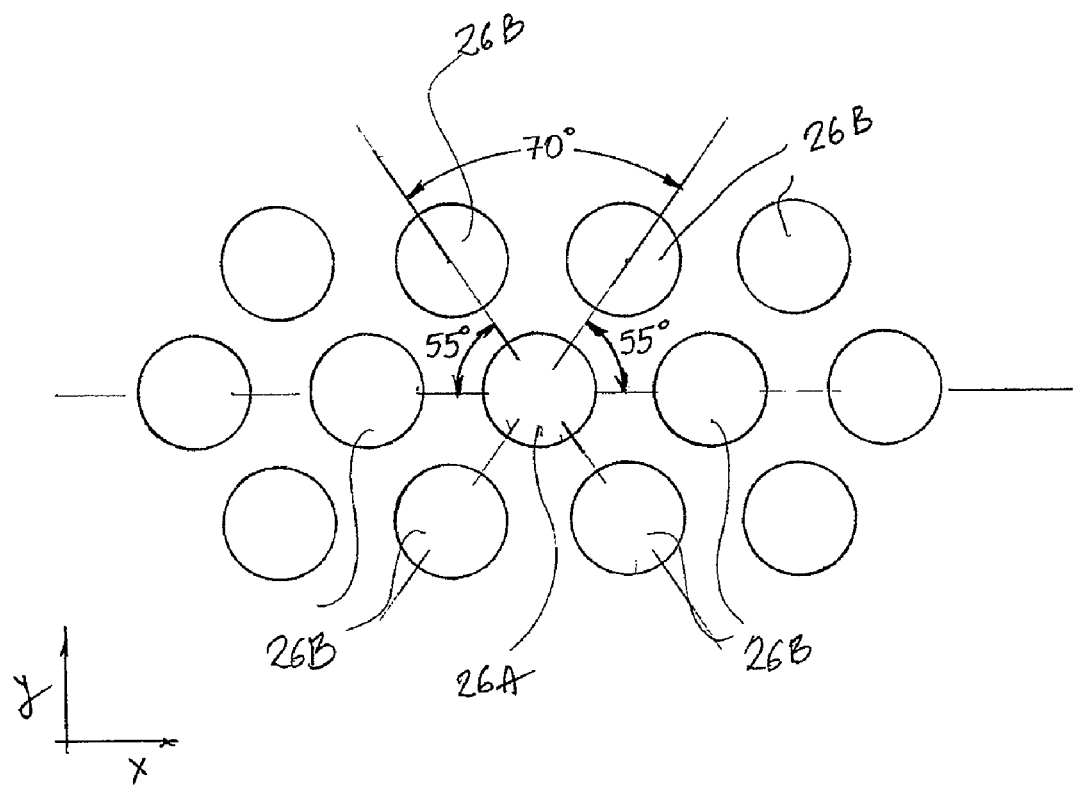
FIG. 2D illustrates a schematic of a modified embodiment of the thermoelectric device of FIG. 2C.

As discussed, the surrounding elements need not be spaced equally about a central element. For example, in some embodiments the six elements surrounding a central element can be positioned at non-equal angles that can vary within a range from about 40 to about 80°. For example, in the embodiment illustrated in FIG. 2D, some of the elements 26B surrounding a central element 26A are spaced at approximately 55° angles from each other, while other elements 26B are spaced at approximately 70° angles. In other embodiments, these angles can be greater or smaller than indicated or illustrated herein. As shown in FIG. 2D, such an arrangement can be advantageous for thermoelectric devices that have an "X"-direction dimension which is shorter than its "Y"-direction dimension. In other embodiments, the elements 22, 24 are arranged in a substantially pentagonal array with the five outer elements spaced at angles of about 72° around a central element. The angles can vary (e.g., plus or minus 20° or more) depending on a particular application. For example, for non-equal arrangements, it may be desirable to vary the angles and general distribution of the elements to achieve a particular density or thermal result.

As discussed herein and illustrated in FIG. 3, offset pairs of dissimilar semiconductor elements 22, 24 can be electrically connected by joining tabs or elements 28. In some embodiments, the joining tabs 28 are disposed on the substrate 32 (not shown). Further, two connector tabs 28 on an opposing substrate 32 (not shown) can join each of the dissimilar thermoelectric elements 22, 24 to a different dissimilar thermoelectric element 22, 24. The connector tabs 28 can be shaped to completely or partially surround the thermoelectric elements 22, 24 and extend therebetween. As shown, the connector tab 28 can narrow or otherwise change shape, size or general configuration in an area between adjacent elements 22, 24. This can advantageously permit the thermoelectric elements 22, 24 to be more tightly packed and/or further reduce the amount of material needed to form the connector tabs 28. For example, as illustrated in the embodiments of, inter alia, FIGS. 2C, 2D, 3 and 9A-9C, the separation distance between adjacent thermoelectric or semiconductor elements can be less than the diameter of the thermoelectric elements. Such a narrowing of the connector tabs can allow for a relatively tightly packed thermoelectric element configuration, thereby increasing the density of thermoelectric elements within the device relative to configurations having a greater inter-semiconductor element spacing.

Accordingly, as described and illustrated herein, the semiconductor elements 22, 24 of a thermoelectric device can be arrayed in a repeating hexagonal, pentagonal, random or any other regular or non-regular pattern. For example, in one generally hexagonal embodiment, the elements 22, 24 are surrounded by six thermoelectric elements 22, 24 positioned around its periphery. This can advantageously help reduce the overall size of the thermoelectric device.

Figure 4:
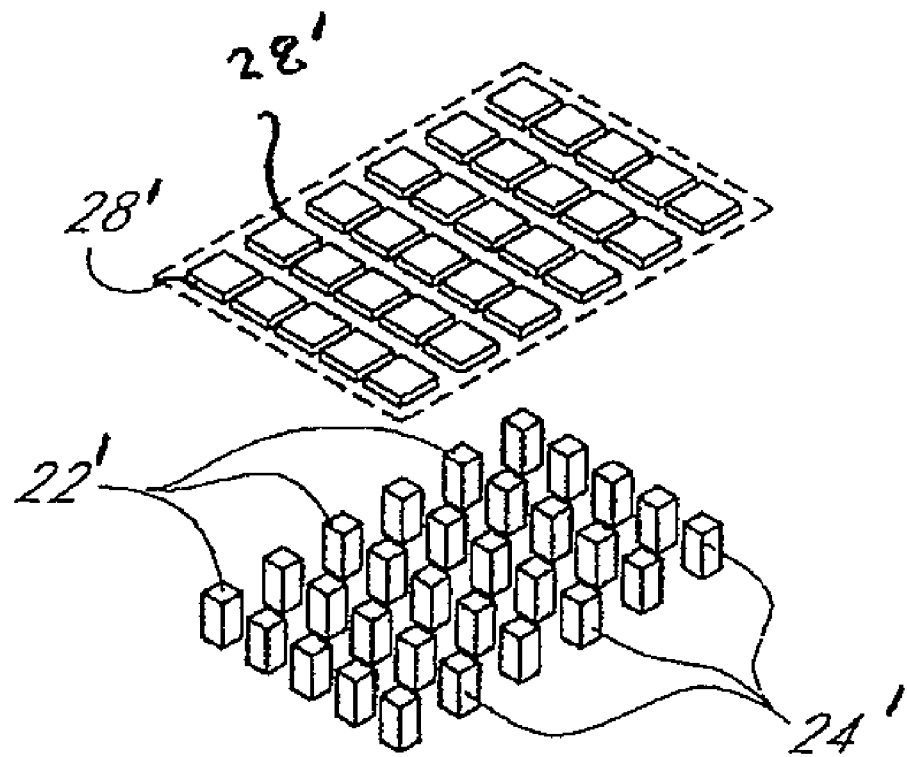
FIG. 4 illustrates an exploded side perspective view of a thermoelectric device according to one embodiment.
Figure 4:
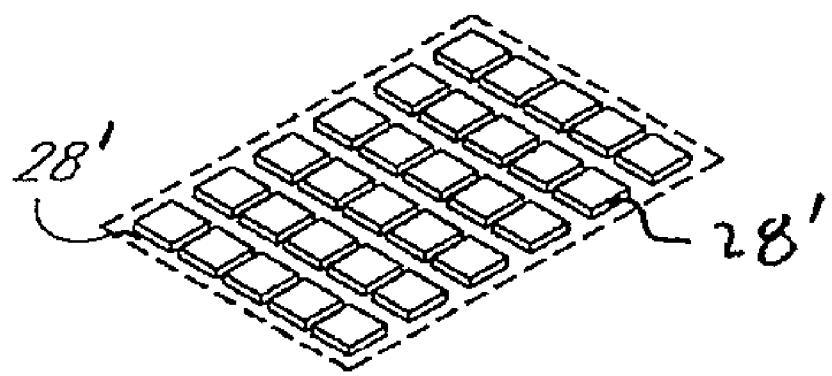

By way of contrast, FIG. 4 illustrates a layout of substantially generally square semiconductor elements 22', 24' arranged in a rectangular array (e.g., with a grid like pattern of rows and columns). The electrical joining tabs or elements 28' are also arranged in a generally rectangular array in order to attached adjacent elements 22', 24'. The enhanced spatial and/or thermal efficiency of the embodiments discussed and illustrated herein (FIGS. 1A-3) become more evident when compared to a standard rectangular arrangement as depicted in FIG. 4. Accordingly, a hexagonal, pentagonal or other arrangement, as described and illustrated herein, can result in a more efficient packing of the elements. For example, arraying the thermoelectric elements 22, 24 in a generally hexagonal arrangement can increase the density of thermoelectric elements 22, 24 by approximately 15% or more for a thermoelectric device of a particular size.

In addition, for thermoelectric device having elements arranged in a hexagonal or other non-rectangular arrangement, the increase in packing efficiency is independent of the desired spacing between thermoelectric elements 22, 24. For example, in a traditional rectangular (e.g., grid) arrangement having the same minimum spacing between adjacent elements, the overall void or gap space in a particular area is generally greater than it is for a hexagonal arrangement. Accordingly, a thermoelectric device having an array using a hexagonal pattern can accommodate a greater number of thermoelectric elements 22, 24 than a substrate 32 in which a rectangular array is used. Alternatively, a desired number of semiconductor elements 22, 24 can be placed in a smaller thermoelectric device if a hexagonal arrangement is used.

In the various embodiments discussed and illustrated herein, the semiconductor elements 22, 24 comprise a generally cylindrical shape with a circular cross-section. However, in alternative embodiments, the elements can have any other cylindrical or prism shapes, with modified cross-sections such as, for example, oval, elliptical, D-shaped, non-circular, polygonal (e.g., triangular, rectangular, other polygonal, etc.), irregular shapes and the like. Thus, in some embodiments, the elements 22, 24 can have one or more flat surfaces extending at least partially between the corresponding joining tabs or members.

Figure 5:
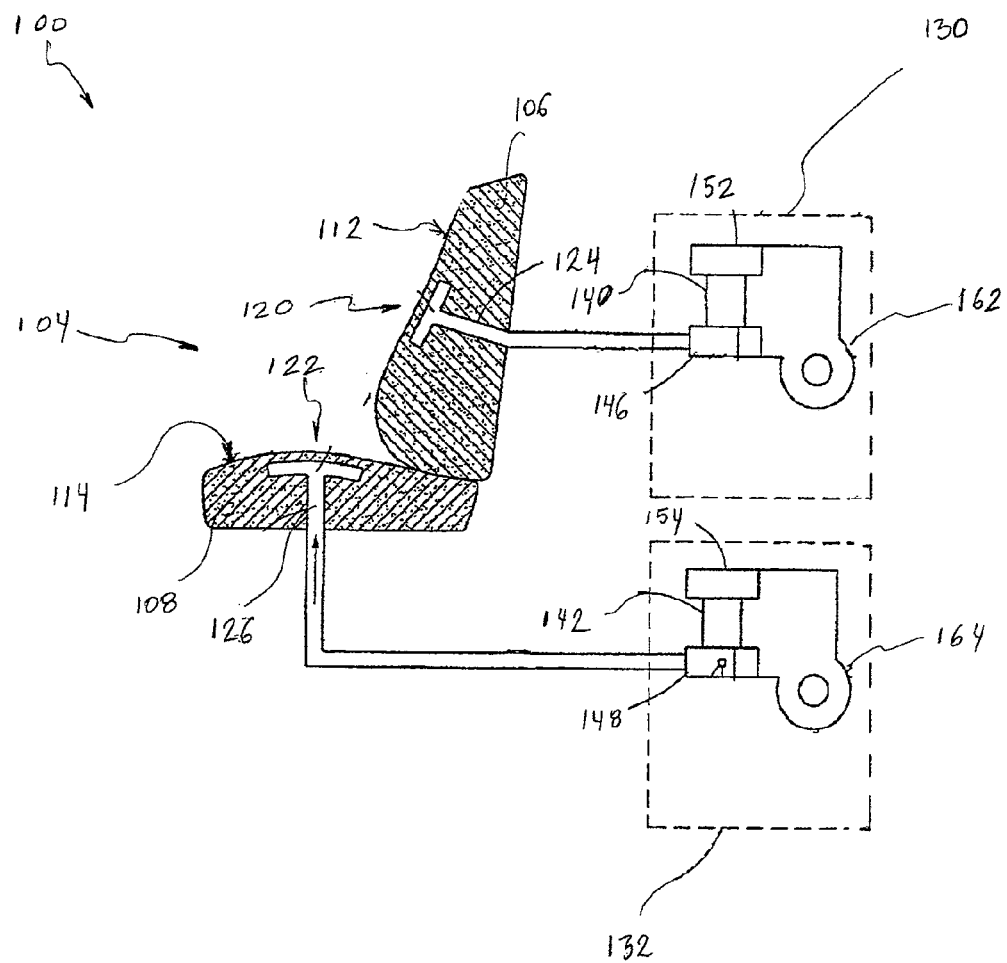
FIG. 5 illustrates a schematic of a climate controlled seating assembly comprising a thermoelectric device in accordance with the embodiments disclosed herein.

FIG. 5 schematically illustrates one embodiment of a climate control system 100, which can utilize the thermoelectric device as described herein. In the depicted embodiment, the climate control system 100 includes a seat back fluid module 130 and seat bottom fluid module 132. One or both of the fluid modules 130, 132 can be configured to provide conditioned or unconditioned air or other fluid to the respective distribution systems 124, 126 formed in the seat assembly 104. Alternatively, the modules 130, 132 can be configured so that air or other fluid is drawn away from the exterior surfaces 112, 114 of the seating assembly 104. Thus, the fluid modules 130, 132 can advantageously provide a desired fluid flow to or from the front surface 112 of the backrest portion 106 and the top surface 114 of the seat portion 108. The climate control apparatus 100 can provide conditioned fluid (e.g., heated and/or cooled) to the exterior surfaces 112, 114 of the seat assembly 104. In other embodiments, unconditioned (e.g., ambient) air or other fluid can be delivered to the seat assembly 104.

With continued reference to FIG. 5, each of the thermal modules 130, 132 can comprise one or more thermoelectric devices 140, 142, as disclosed herein. The thermoelectric devices 140, 142 can facilitate with temperature conditioning (e.g., selectively healing or cooling) fluid flowing through or near the devices 140, 142. As illustrated in FIG. 5, the fluid modules 130, 132 can include one or more heat exchanger members 146,148,152,154 located on one or both sides of the thermoelectric devices 140, 142. Such heat exchanger members (e.g., copper fins) can help facilitate heat transfer to the fluid being delivered to the seat assembly 104 and/or enhance the heat transfer between the waste stream and the ambient air.

As illustrated in FIG. 5, the fluid modules 130, 132 advantageously include one or more fluid transfer members 162, 164 (e.g., fans, blowers, etc.) to help move air or other fluid to or from the fluid distribution systems 120, 122. Each distribution system 120, 122 can include one or more conduits 124, 126 that are in fluid communication with the fluid modules 130, 132. For additional details regarding such systems, please see U.S. patent application Ser. No. 10/973,947, filed Oct. 25, 2004 and published as U.S. Publication No. 2006/0087160, the entirety of which is hereby incorporated by reference herein.

It will be appreciated that the number, configuration, spacing, location and other details regarding the thermoelectric devices 140, 142, heat exchange members 146,148,152,154, fluid transfer devices 162, 164, fluid distribution systems 120, 122, other components or portions of the fluid modules 130, 132 and/or any other item of a climate control system can be different than illustrated and discussed herein. For example, in some embodiments, a fluid module may comprise a fluid transfer device but not a thermoelectric device. In other embodiments, a fluid module 130, 132 can share one or more components (e.g., pumping devices, thermoelectric devices, etc.) with a vehicle's general climate control system or another climate control system. Although the thermoelectric device has been described herein in the context of certain embodiments, such as, for example, a climate controlled seating assembly for an automobile or other vehicle, the thermoelectric device and variations thereof can be used in any other context. For example, thermoelectric devices similar to those disclosed and illustrated herein can be used in other seating assemblies (e.g., beds, office chairs, other vehicular seats, sofas, etc.).

Figure 6:
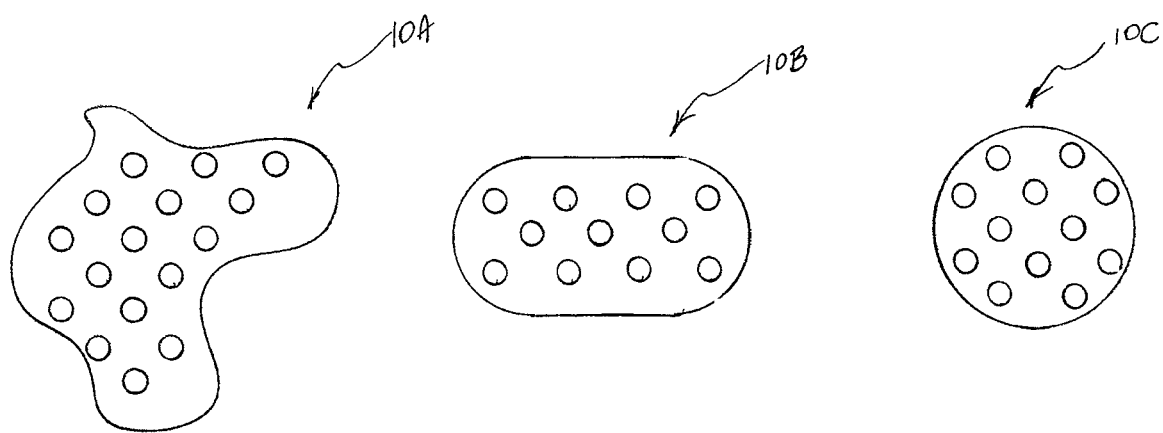
FIG. 6 illustrates several embodiments of thermoelectric devices that can be configured according to the features disclosed herein.

Further, it will be appreciated that the thermoelectric devices, as well as their various components (e.g., substrates, heat transfer members, thermal conductive layer, etc.), that comprise semiconductor elements arranged in a hexagonal and other advantageously-packed patterns, can have any overall shape. For example, in the embodiments disclosed herein, the thermoelectric devices include a generally rectangular shape. However, the thermoelectric device can have any other shape as desired or required by a particular application, such as, for example, circular, elliptical, oval, polygonal, irregular and/or the like. Some non-limiting examples of such thermoelectric devices 10A, 10B, 10C, are illustrated in FIG. 6.

Figure 7A:
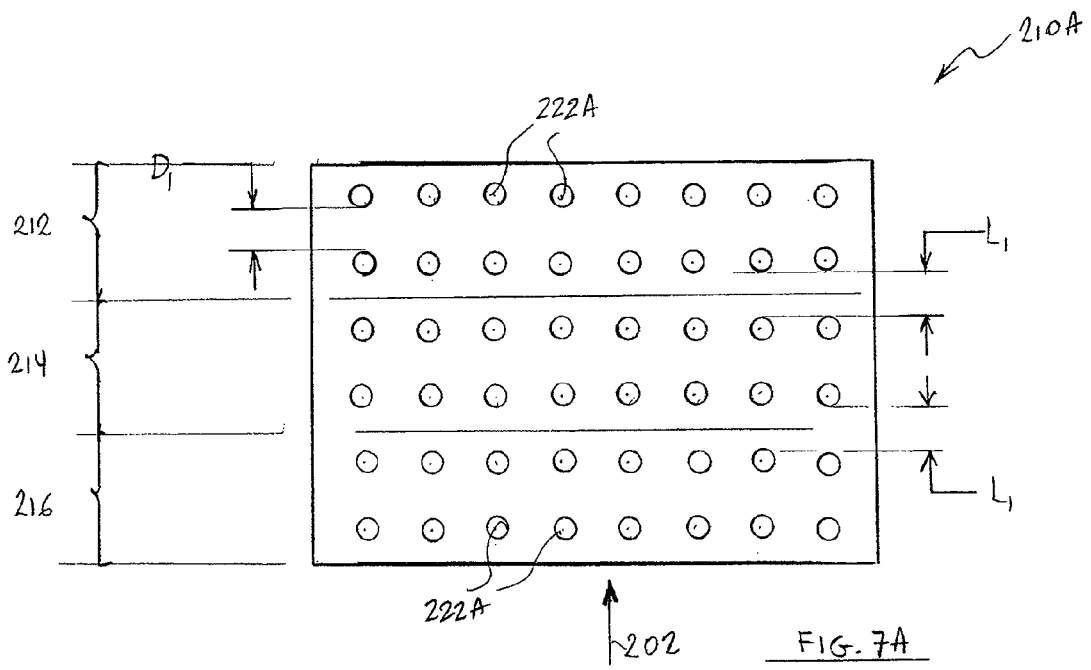
FIG. 7A illustrates a top view of a thermoelectric device having semiconductor elements arranged in a rectangular (e.g., grid-like) pattern.
Figure 7B:
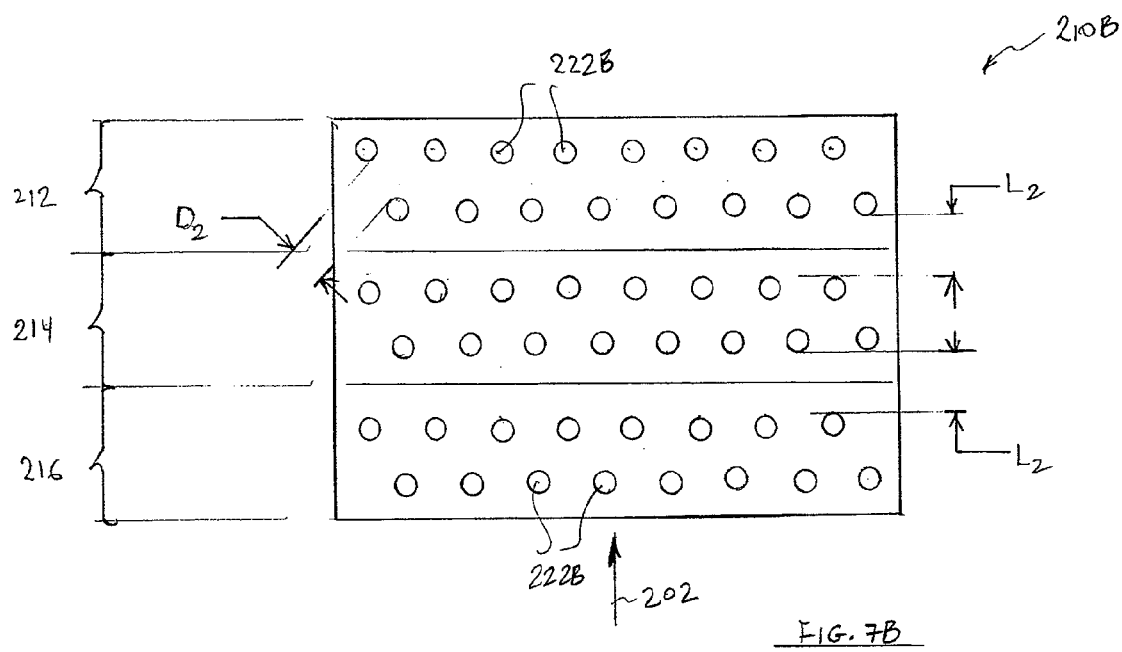
FIG. 7B illustrates a top view of a thermoelectric device having semiconductor elements arranged in a space-saving pattern according to one embodiment.

FIG. 7A illustrates a thermoelectric device 210A having three distinct areas 212, 214, 216. In some embodiments, as shown, it is desirable to thermally isolate these three areas 212, 214, 216 of the device 210A in the direction of air or other fluid flow (generally represented by arrow 202 in the depicted arrangement). It will be appreciated that a thermoelectric device 210A can include more or fewer thermally isolated sections than illustrated and discussed herein. In addition, the different areas can be isolated along a direction opposite of what is illustrated in FIGS. 7A and 7B, either in addition to or in lieu of having thermal partitions perpendicular to the direction of fluid flow relative to the device 210A. The illustrated device 210A includes semiconductor elements or pellets 222A which are arranged in a rectangular or grid-like pattern. This is true for elements in all three sections 212, 214, 216 of the device 210A.

With reference to FIG. 7B, the depicted thermoelectric device 210B comprises the same general size, shape, thermal isolation sections and other overall characteristics of the device 210A in FIG. 7A. However, as shown, the semiconductor elements 222B in the device 210B of FIG. 7B are arranged in a generally triangular or offset pattern, while still maintaining the desired or minimum spacing $D_2$ between adjacent elements within a particular thermal section 212, 214, 216 (e.g., $D_1 \approx D_2$). Consequently, because the semiconductor elements within the device 210B of FIG. 7B have a generally triangular or offset orientation, the distance $L_2$ between semiconductor elements 222B across adjacent thermal section 212, 214, 216 can be reduced (e.g., $L_2 > L_1$). Thus, arranging the semiconductor elements of a thermoelectric device in a generally hexagonal, triangular or other space saving pattern can enhancing the thermal isolation between different sections 212, 214, 216. In some embodiments, thermal isolation between thermoelectric elements in at least one direction across a thermoelectric system can provide increased efficiency over conventional thermoelectric arrays. A detailed description of such an arrangement can be found in U.S. Pat. No. 6,539,725, the entirety of which is hereby incorporated by reference herein.

In other embodiments, adjacent rows of semiconductor elements 222B can be separated by one or more thermal isolation members or features. For example, one or more materials having a relatively low thermal conductivity can be selectively positioned between adjacent rows of elements. In other embodiments, an air gap or other similar feature can be used to enhance thermal isolation, either in lieu of or in addition to using a non- or low thermally conductive material.

In some embodiments, it may be desirable to include enhanced temperature conditioning (e.g., heating or cooling) of air or other fluid within one or more targeted regions of the device. For example, as illustrated in FIG. 8B, a thermoelectric device 310B can be "front loaded". In other words, for various heat transfer purposes, it is sometimes desirable to a thermoelectric device 310B can comprise a higher density of semiconductor elements 328B in the area 314 (e.g., "front") that first encounters the incoming fluid (generally represented by arrows 302 in FIGS. 8A and 8B). In some embodiments, this is true because the heat transfer coefficient of the heat transfer members (e.g., fins) positioned adjacent to the "front" of the device 310B is highest at that location. Consequently, a higher density of semiconductor elements 328B toward the "front" of the device 310B can take advantage of such favorable heat transfer properties. Therefore, the hexagonal or other space-saving patterns disclosed herein enable a thermoelectric device to comprise more semiconductor elements 328B in one or more areas. In FIG. 8B, the elements 326 positioned towards the "rear" 312 of the device 310B have a less dense spacing.

Figure 8A:
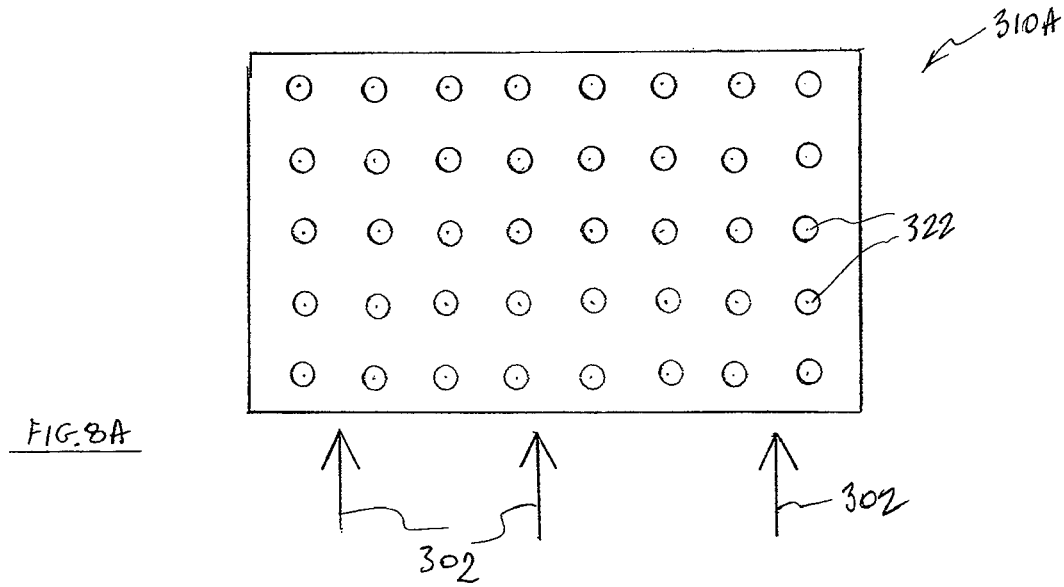
FIG. 8A illustrates a top view of a thermoelectric device having semiconductor elements arranged in a rectangular (e.g., grid-like) pattern.
Figure 8B:
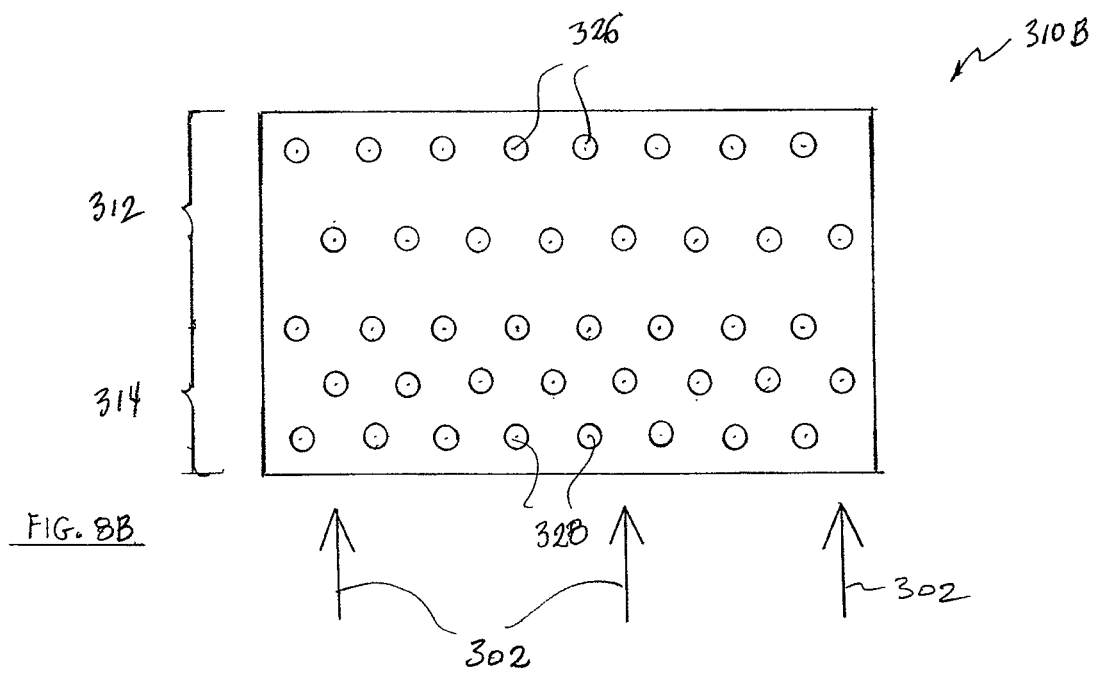
FIG. 8B illustrates a top view of a thermoelectric device having semiconductor elements arranged in a space-saving pattern according to another embodiment.

By way of contrast, it is more difficult to vary the density of semiconductor elements 322 in a traditional, grid pattern thermoelectric device 310A, such as the one illustrated in FIG. 8A. This is especially true if it is desirable or necessary to maintain a particular spacing between adjacent elements 322. Consequently, the number of elements 322 that can be included in a particular area of the thermoelectric device 310A will be lower than in a device 310B having a hexagonal, triangular or other space-saving pattern as disclosed herein.

FIGS. 9A through 9C illustrate another embodiment of a thermoelectric device 410 having closely packed semiconductor elements 424. As shown, the elements or pellets 424 can be configured in such a tight hexagonal pattern so that they contact one another. This can advantageously facilitate and/or speed up the manufacturing and/or assembling process for such thermoelectric devices 410. Consequently, such a simplified configuration can also help reduce overall manufacturing and/or assembly costs.

The semiconductor elements 424 can be joined to each other using one or more attachment methods. For example, as illustrated in the detailed plan view of FIG. 9B, an adhesive 430 can be used to spot bond the elements 424 to each other. In other embodiments, one or more other attachment substances, devices and/or methods can be used to join the elements 424, either in lieu of or in addition to using adhesives.

FIG. 9C illustrates the electrically conductive joining members or tabs 440 that connect the semiconductor elements 424 in series, as disclosed herein. The joining members 440, which are shown in phantom because they are positioned underneath the depicted semiconductor elements 424, have a generally figure eight shape. As discussed, it will be appreciated that the shape, size, spacing, orientation and/or other details of the elements 424, the conductive joining members 440 and/or any other component of the device 410 can vary.

Figure 10A:
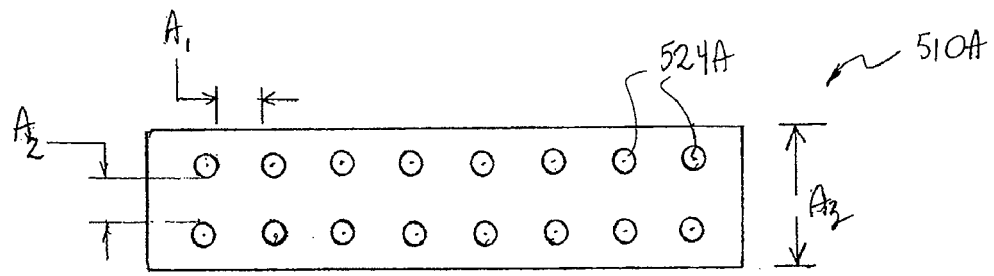
FIG. 10A illustrates a top view of a thermoelectric device having semiconductor elements arranged in a rectangular (e.g., grid-like) pattern.
Figure 10B:
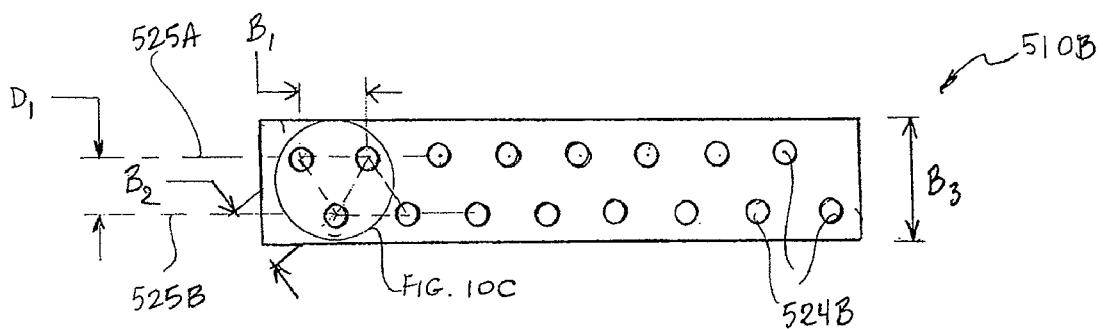
FIGS. 10B and 10C illustrate top views of semiconductor elements of a thermoelectric device arranged in a triangular pattern according to one embodiment.

In FIG. 10A, the depicted thermoelectric device 510A has a plurality of semiconductor elements 524A that are oriented in a generally grid-like (e.g., square) pattern. By way of example, FIG. 10B illustrates a different embodiment of a thermoelectric device 510B having the same number of semiconductor elements 524B. However, as shown, the elements 524B of the device 510B of FIG. 10B are oriented in an offset pattern. This permits the density of the elements 524B to be increased, even if the desired spacing between adjacent elements 524B remains the same as in FIG. 10A (e.g., $A_1=A_2 \approx B_1=B_2$). Consequently, the overall size of the thermoelectric device in FIG. 10B can be decreased. For example, assuming the length of the devices 510A, 510B remains constant, the width $B_3$ of the device in FIG. 10B is smaller than the width $A_3$ of the device in FIG. 10A.

Figure 10C:
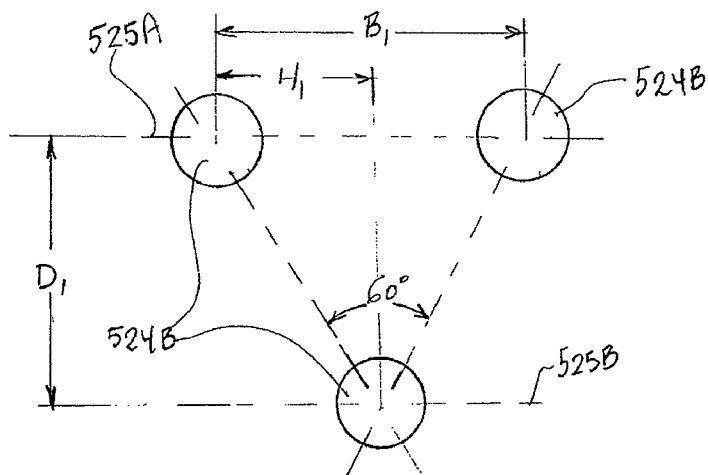

As illustrated in FIGS. 10B and 10C, a true hexagonal pattern is not possible when a thermoelectric device 510B includes only two rows. Thus, in such embodiments, the offset or space-saving orientation of the semiconductor elements assumes more of a triangular pattern. For example, in the illustrated embodiment, adjacent elements 524B form an equilateral triangle (e.g., 60° angles). In other embodiments, however, the elements 524B need not be oriented along an equilateral triangle (e.g., the angles of the triangle can be greater or less than 60°). In addition, the elements 524B can be oriented along a non-triangular space-saving orientation.

In the embodiment illustrated in FIGS. 10B and 10C, as well as other embodiments disclosed herein, regardless of the number of rows 525A, 525B of semiconductor elements 524B that a thermoelectric device 510B includes, the semiconductor elements 524B of one row 525B can be arranged so that they are positioned generally halfway between the elements 524B of an adjacent row 525A. As shown in the detailed view of FIG. 10C, the semiconductor element 524B on the lower row 525B is located generally halfway between the semiconductor elements 524B on the upper row 525A. Thus, in the illustrated embodiment, $H_1$ is approximately one-half of $B_1$ (e.g., $H_1 \approx \frac{1}{2} B_1$). It will be appreciated that in other embodiments, the semiconductor elements 524B of one row may not be positioned exactly or substantially half-way between the semiconductor elements 524B of the adjacent row. For example, the semiconductor elements 524B of one row may be positioned approximately one-fourth, one-third or any other fraction of the distance between the semiconductor elements 524B of the adjacent row. Thus, the semiconductor elements 524B of one row can be skewed or offset from the semiconductor elements 524B of the adjacent row.

Figure 10D:
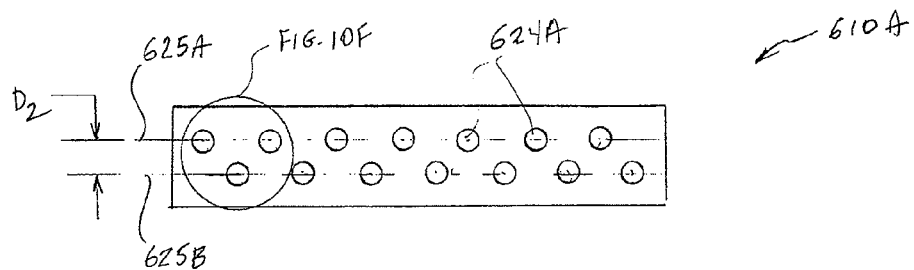
FIG. 10D illustrates a top view of semiconductor elements of a thermoelectric device arranged in a generally triangular pattern according to another embodiment.
Figure 10E:
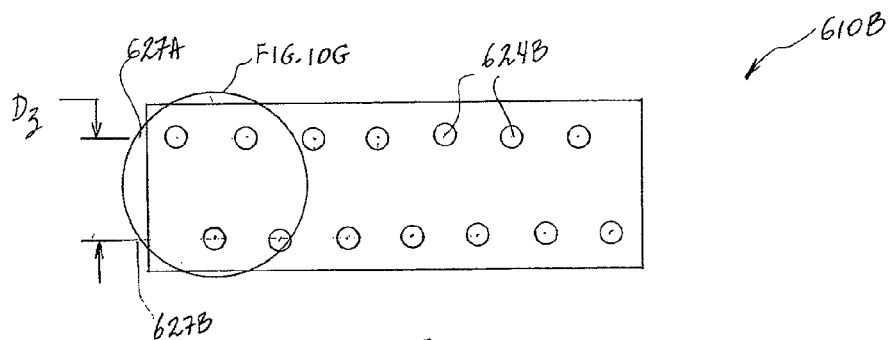
FIG. 10E illustrates a detailed view of three semiconductor elements of the thermoelectric device in FIG. 10D.
Figure 10F:
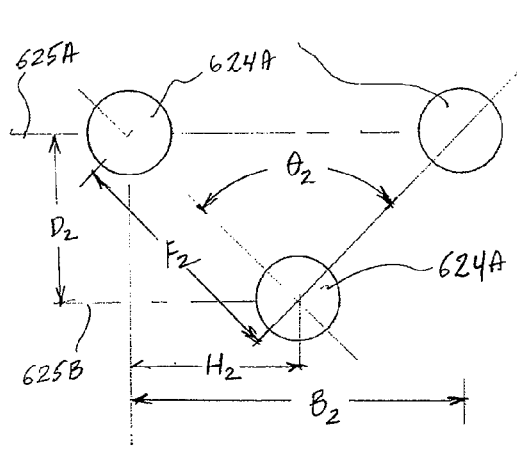
FIG. 10F illustrates a top view of semiconductor elements of a thermoelectric device arranged in a generally triangular pattern according to yet another embodiment.

Additional embodiments of thermoelectric devices 610A, 610B having only two rows of semiconductor elements are illustrated in FIGS. 10D through 10G. With reference to FIGS. 10D and 10F, the adjacent rows 625A, 625B of semiconductor elements 624A are generally closer together than in the embodiment illustrated in FIGS. 10B and 10C. Therefore, the distance $D_2$ between adjacent rows 625A, 625B in FIG. 10D is generally smaller than the distance $D_1$ between adjacent rows in FIG. 10B (e.g., $D_1 > D_2$). However, like in FIGS. 10B and 10C, the semiconductor elements 624A of one row 625A are generally half-way between the semiconductor elements 624A of the adjacent row 625B (e.g., $H_2 \approx \frac{1}{2} B_2$).

Likewise, in FIG. 10E, the semiconductor elements 624B of one row 627A are generally half-way between the semiconductor elements 624B of the adjacent row 627B (e.g., $H_3 \approx \frac{1}{2} B_3$). However, in the embodiment illustrated in FIG. 10E, the adjacent rows 627A, 627B of semiconductor elements 624B are generally farther apart than in the embodiments illustrated in FIGS. 10B and 10D (e.g., $D_3 > D_1 > D_2$). It will be appreciated that in other embodiments, such as those illustrated in FIGS. 1A, 2C, 2D and/or elsewhere herein, a thermoelectric device can have more that two rows of semiconductor elements. In addition, the spacing between adjacent rows can be greater or less than illustrated and discussed herein. Further, the spacing between adjacent rows can be the same or different between adjacent sets of rows, if a thermoelectric comprises more than two rows of semiconductor elements.

As illustrated in FIGS. 10B through 10G, one effect of varying the spacing $D_1$, $D_2$, $D_3$ between adjacent rows of semiconductor elements 524B, 624A, 624B is to vary the internal angles of the triangular shape formed by groups of three adjacent elements 524B, 624A, 624B. For example, in FIGS. 10B and 10C, the spacing $D_1$ between adjacent rows 525A, 525B has been selected so that the spacing between the semiconductor elements 524B remains generally constant, both between elements in the same row and between elements in adjacent rows ($B_1 \approx B_2$). Consequently, the semiconductor elements 524B are generally spaced at approximately 60° from each other.

However, the distance between semiconductor elements in a particular row can be different than the distance between elements from one row to an adjacent row. For example, in the embodiment illustrated in FIGS. 10D and 10F, the spacing $B_2$ of semiconductor elements 624A in a row 625A, 625B is generally greater than the spacing $F_2$ of semiconductor elements 624A from one row 625A to an adjacent row 625B (e.g., $B_2 > F_2$). Consequently, the internal angles of the triangular shape formed by three adjacent elements 624A can be different from one another. In the illustrated embodiment, internal angle $\theta_2$ is generally smaller than 60°. For example, $\theta_2$ can be 55°, 50°, 45°, 40°, 35°, 30°, 25°, 20°, 15°, 10°, 5° of any angle between these values. In other embodiments, $\theta_2$ is greater than 55° or smaller than 5°. Further, if the semiconductor elements 624A of one row 625B are generally located half-way between the semiconductor elements 624A of an adjacent row 625A, the two other internal angles (e.g., other than $\theta_2$) will be generally equal to one another. For instance, if $\theta_2$ is about 40°, each of the other internal angles will be approximately 70°.

Figure 10G:
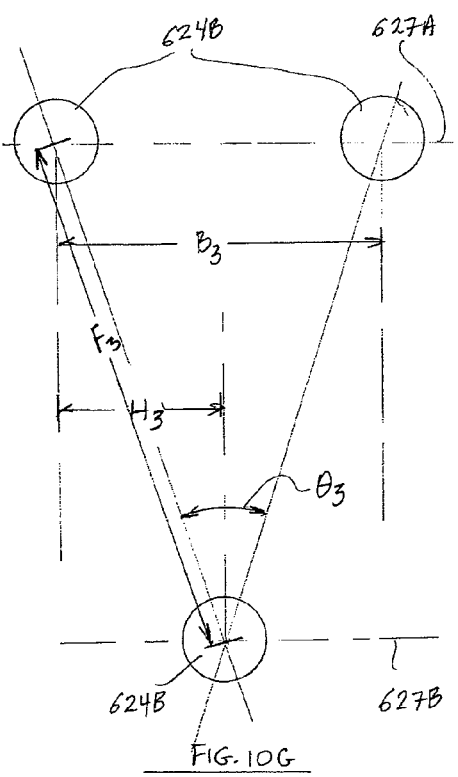
FIG. 10G illustrates a detailed view of three semiconductor elements of the thermoelectric device in FIG. 10F.

As illustrated in FIGS. 10E and 10G, internal angle $\theta_3$ can be larger than 60° if the spacing $B_3$ of semiconductor elements 624B in a row 627A, 627B is generally smaller than the spacing $F_3$ of semiconductor elements 624B from one row 627A to an adjacent row 627B (e.g., $B_3 > F_3$). Therefore, the internal angles of the triangular shape formed by three adjacent elements 624B can be different from one another. In the illustrated embodiment, internal angle $\theta_3$ is generally greater than 60°. For example, $\theta_3$ can be 70°, 80°, 90°, 100°, 110°, 120°, 130°, 140°, 150°, 160° of any angle between these values. In other embodiments, $\theta_3$ is greater than 160° or smaller than 70°. Further, if the semiconductor elements 624B of one row 627B are generally located half-way between the semiconductor elements 624B of an adjacent row 627A, the two other internal angles (e.g., other than $\theta_3$) will be generally equal to one another. For instance, if $\theta_3$ is about 120°, each of the other internal angles will be approximately 30°.

In some embodiments, two of the internal angles of the triangle formed by three adjacent semiconductor elements are approximately equal. Each of the two substantially identical internal angles of the triangle can be greater than 45° or smaller than 45°. For example, each of the substantially identical internal angles of the triangle can be 10°, 20°, 30°, 40°, 50°, 60°, 70°, 80° or any angle between these values.

As discussed, however, the semiconductor elements of one row need not be positioned approximately half-way between the semiconductor elements of an adjacent row. For example, the elements can be skewed or offset so that the distance between adjacent elements varies depending on where they are located within the thermoelectric device. Further, in at least some of the embodiments disclosed herein, the semiconductor elements have been illustrated as having a circular shape, and the thermoelectric devices have been illustrated as having a generally rectangular shape. However, the shape, size, location, configuration and/or other details, features or properties of the elements, thermoelectric devices and/or other components of such systems can be varied, as desired or required by a particular application.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while the number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with, or substituted for, one another in order to perform varying modes of the disclosed invention. Thus, it is intended that the scope of the present invention herein disclosed should not be limited by the particular disclosed embodiments described above, but should be determined only by a fair reading of the claims.

What is claimed is:

1. A thermoelectric device comprising:
   a first substrate and a second substrate disposed apart from each other, the first and second substrates configured to provide electrical insulation;
   a plurality of semiconductor elements comprising a first set of semiconductor elements and a second set of semiconductor elements, the first and second sets of semiconductor elements having dissimilar electrical properties, each of the plurality of semiconductor elements having a first end disposed towards the first substrate, a second end disposed towards the second substrate and a body extending between the first and second end, the plurality of semiconductor elements disposed in a substantially hexagonal array comprising rows in which semiconductor elements of the first and second sets of semiconductor elements alternate; and
   a first set of electrical conductors and a second set of electrical conductors; each of the first set of electrical conductor being electrically coupled to the first end of a semiconductor element of the first set of semiconductor elements and the first end of a semiconductor element of the second set of semiconductor elements, each of the second set of electrical conductors are electrically coupled to the second end of a semiconductor element of the first set of semiconductor elements and the a second end of a semiconductor element of the second set of semiconductor elements such that the plurality of semiconductor elements are electrically coupled to each other in series and in an alternating arrangement;
   wherein a separation distance between adjacent semiconductor elements is less than a diameter of the semiconductor elements, and wherein at least some of the electrical conductors comprise a width, in a dimension perpendicular to the separation distance, that is less than the diameter of the semiconductor elements, so that a density of the hexagonally-arranged semiconductor elements can be increased.

2. The thermoelectric device of claim 1, wherein the bodies of at least some of the semiconductor elements comprise a substantially circular cross-section.

3. The thermoelectric device of claim 1, wherein the semiconductor elements comprise a substantially cylindrical shape.

4. The thermoelectric device of claim 3, wherein the bodies of the substantially cylindrical semiconductor elements comprise a substantially circular cross-section.

5. The thermoelectric device of claim 1, wherein the bodies of at least some of the semiconductor elements comprise a cross-sectional shape that includes at least one flat side.

6. The thermoelectric device of claim 1, wherein the hexagonal array includes a group of six semiconductor elements that have centers that are equally separated by an angle of about 60 degrees about a center of a central semiconductor element.

7. The thermoelectric device of claim 1, wherein the hexagonal array includes a group of six semiconductor elements that have centers that are separated by an angle of about 40 degrees to about 80 degrees about a center of a central semiconductor element.

8. The thermoelectric device of claim 1, wherein at least some adjacent semiconductor elements are configured to generally contact one another.

9. The thermoelectric device of claim 1, wherein the thermoelectric device is configured to provide thermal isolation between at least some of the semiconductor elements.

10. The thermoelectric device of claim 9, wherein the thermal isolation comprises a second spacing between adjacent semiconductor elements, wherein at least some adjacent semiconductor elements are separated by a first spacing, and wherein said second spacing is greater than said first spacing, thereby creating at least two regions within the thermoelectric device with varying semiconductor element density per unit area.

11. A thermoelectric device comprising:
    first and second substrates;
    a plurality of semiconductor elements comprising a center, the semiconductor elements disposed between the first and second substrates, the plurality of semiconductor elements comprising a first group of semiconductor elements having a first set of electrical properties and a second group of semiconductor elements having a second set of electrical properties, wherein the semiconductor elements are arranged in a hexagonal pattern between the first and second substrates; and
    a first set of electrical conductors disposed between the plurality of semiconductors and the first substrate; and
    a second set of electrical conductors disposed between the plurality of semiconductors and the second substrates;
    wherein the plurality of semiconductor elements, the first set of electrical conductors and the second set of electrical conductors are arranged such that the plurality of semiconductor elements are electrically coupled to each other in series with the first and second groups of semiconductor elements in an alternating arrangement;
    wherein the semiconductor elements are positioned along at least two generally linear rows; and
    wherein semiconductor elements from a row are generally positioned half-way between semiconductor elements from an adjacent row;
    wherein the centers of each of at least three immediately adjacent semiconductor elements form a triangle shape, the triangle shape comprising three internal angles;

wherein a separation distance between adjacent semiconductor elements is less than a diameter of the semiconductor elements;

wherein each of the electrical conductors comprises a unitary structure having a narrowed middle portion to avoid contact with adjacent semiconductor elements; and wherein each of the narrowed middle portions of the electrical conductors comprises a width, in a dimension perpendicular to the separation distance, that is less than a diameter of the semiconductor elements.

12. The thermoelectric device of claim 11, wherein at least some of the plurality of semiconductor elements comprise a substantially circular cross-section.

13. The thermoelectric device of claim 11, wherein the plurality of semiconductor elements comprise a substantially cylindrical shape.

14. The thermoelectric device of claim 13, wherein the body of the substantially cylindrical semiconductor elements comprise a substantially circular cross-section.

15. The thermoelectric device of claim 11, wherein each of the internal angles of the triangle is approximately 60 degrees.

16. The thermoelectric device of claim 11, wherein at least two of the internal angles of the triangle are approximately equal.

17. The thermoelectric device of claim 16, wherein each of the at least two equal internal angles of the triangle is generally greater than 50 degrees.

18. The thermoelectric device of claim 16, wherein each of the at least two equal internal angles of the triangle is generally less than 40 degrees.

19. The thermoelectric device of claim 11, wherein each of the internal angles of the triangle is approximately 20 to 80 degrees.

20. A thermoelectric device comprising:
a first substrate;
a second substrate generally parallel with and separated from the first substrate, the first and second substrates configured to provide electrical insulation;
a plurality of semiconductor elements comprising a first set of semiconductor elements and a second set of semiconductor elements, the first and second sets of semiconductor elements having dissimilar electrical properties, each of the plurality of semiconductor elements having a first end disposed towards the first substrate, a second end disposed towards the second substrate and a body extending between the first and second end;
wherein the plurality of semiconductor elements are disposed in a substantially hexagonal array comprising rows in which semiconductor elements of the first and second sets of semiconductor elements alternate; and
a first set of electrical connector tabs and a second set of electrical connector tabs; each of the first set of electrical connector tabs being electrically coupled to the first end of a semiconductor element of the first set of semiconductor elements and the first end of a semiconductor element of the second set of semiconductor elements, each of the second set of electrical connector tabs are electrically coupled to the second end of a semiconductor element of the first set of semiconductor elements and the a second end of a semiconductor element of the second set of semiconductor elements such that the plurality of semiconductor elements are electrically coupled to each other in series;

wherein at least one of the electrical connector tabs of the first set of electrical connector tabs and the second set of electrical connector tabs comprises a width, in a dimension perpendicular to a separation distance between adjacent semiconductor elements, that is generally smaller than the cross-sectional dimension of the semiconductor elements to which such electrical connector tab couples, to avoid contact with adjacent semiconductor elements, thereby increasing a density of the semiconductor elements with the thermoelectric device.

21. The thermoelectric device of claim 20, wherein a separation distance between adjacent semiconductor elements is less than a diameter of the semiconductor elements.

22. A thermoelectric device comprising:
a first substrate;
a second substrate generally parallel with and separated from the first substrate, the first and second substrates configured to provide electrical insulation;
a plurality of semiconductor elements comprising a first set of semiconductor elements and a second set of semiconductor elements, the first and second sets of semiconductor elements having dissimilar electrical properties, each of the plurality of semiconductor elements having a first end disposed towards the first substrate, a second end disposed towards the second substrate and a body extending between the first and second end;
wherein the plurality of semiconductor elements comprise a generally circular shape and are disposed in a substantially hexagonal array between the first and second substrates so as to increase a density of semiconductor elements within a particular space of the thermoelectric device; and
a first set of electrical connector tabs and a second set of electrical connector tabs; each of the first set of electrical connector tabs being electrically coupled to the first end of a semiconductor element of the first set of semiconductor elements and the first end of a semiconductor element of the second set of semiconductor elements, each of the second set of electrical connector tabs are electrically coupled to the second end of a semiconductor element of the first set of semiconductor elements and the a second end of a semiconductor element of the second set of semiconductor elements such that the plurality of semiconductor elements are electrically coupled to each other in series and in an alternating arrangement;
wherein a separation distance between adjacent semiconductor elements is less than a diameter of the semiconductor elements, and wherein at least one of the electrical connector tabs of the first set of electrical connector tabs and the second set of electrical connector tabs comprises a width, in a dimension perpendicular to the separation distance, that is less than the diameter of the semiconductor element.

* * * * *